(12) United States Patent
Endo

(10) Patent No.: US 8,472,007 B2
(45) Date of Patent: Jun. 25, 2013

(54) SUBSTRATE HOLDING DEVICE, LITHOGRAPHY APPARATUS USING SAME, AND DEVICE MANUFACTURING METHOD

(75) Inventor: Masatoshi Endo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 275 days.

(21) Appl. No.: 12/752,709

(22) Filed: Apr. 1, 2010

(65) Prior Publication Data

US 2011/0086298 A1    Apr. 14, 2011

(30) Foreign Application Priority Data

Apr. 6, 2009  (JP) ................. 2009-092458
Dec. 15, 2009  (JP) ................. 2009-284545
Mar. 19, 2010  (JP) ................. 2010-063566

(51) Int. Cl.
   *G03B 27/58* (2006.01)
   *G03B 27/62* (2006.01)

(52) U.S. Cl.
   USPC ............................. 355/72; 355/75

(58) Field of Classification Search
   USPC ............ 355/72–76; 378/34, 35; 269/21
   See application file for complete search history.

(56) References Cited

U.S. PATENT DOCUMENTS

| 7,425,238 | B2 | 9/2008 | Muto |
| 7,582,491 | B2 * | 9/2009 | Sasaki et al. ............... 438/14 |
| 7,889,323 | B2 * | 2/2011 | Sung ........................ 355/73 |
| 2004/0150172 | A1 | 8/2004 | Muto |

FOREIGN PATENT DOCUMENTS

| JP | 10-070069 A | 3/1998 |
| JP | 10-070179 A | 3/1998 |
| JP | 2004-140071 A | 5/2004 |
| JP | 2008-198754 A | 8/2008 |

\* cited by examiner

*Primary Examiner* — Hung Henry Nguyen
(74) *Attorney, Agent, or Firm* — Canon U.S.A., Inc., IP Division

(57) ABSTRACT

The substrate holding device of the present invention includes a holding unit that adsorbs and holds the substrate, a measuring section that measures a physical quantity relating to a adsorption force of the holding unit with the substrate mounted on the holding unit; and a control section that carries out a first determination based on a first condition and a measurement result obtained by the measuring section and a second determination based on a second condition that is different from the first condition and a measurement result obtained by the measuring section to select one of at least three preset operations based on the result of first and second determinations to thereby execute processing depending on the selected operation.

22 Claims, 18 Drawing Sheets

FIG. 8B

| | SUBSTRATE STAGE 50 | | | | | | SUBSTRATE TRANSPORT DEVICE 51 | | | | | |
|---|---|---|---|---|---|---|---|---|---|---|---|---|
| | | SPEED | | ACCELERATION | | | | SPEED | | ACCELERATION | | |
| NORMAL | X: | 10 | mm/sec | 9.8 | mm/sec² | | X: | 10 | mm/sec | 9.8 | mm/sec² |
| | Y: | 8 | mm/sec | 9.8 | mm/sec² | | Y: | 10 | mm/sec | 9.8 | mm/sec² |
| | Z: | 3 | mm/sec | 0.8 | mm/sec² | | Z: | 5 | mm/sec | 9.8 | mm/sec² |
| | | SPEED | | ACCELERATION | | | | SPEED | | ACCELERATION | | |
| SUBSTRATE DEFORMATION | X: | 10 | mm/sec | 4.8 | mm/sec² | | X: | 5 | mm/sec | 4.8 | mm/sec² |
| | Y: | 8 | mm/sec | 4.8 | mm/sec² | | Y: | 5 | mm/sec | 4.8 | mm/sec² |
| | Z: | 3 | mm/sec | 0.4 | mm/sec² | | Z: | 5 | mm/sec | 4.8 | mm/sec² |
| | | SPEED | | ACCELERATION | | | | SPEED | | ACCELERATION | | |
| CHUCK ANOMALY | X: | 1 | mm/sec | 0.8 | mm/sec² | | X: | 10 | mm/sec | 9.8 | mm/sec² |
| | Y: | 1 | mm/sec | 0.8 | mm/sec² | | Y: | 10 | mm/sec | 9.8 | mm/sec² |
| | Z: | 1 | mm/sec | 0.8 | mm/sec² | | Z: | 5 | mm/sec | 9.8 | mm/sec² |
| | | SPEED | | ACCELERATION | | | | SPEED | | ACCELERATION | | |
| SUBSTRATE'S BACK SIDE ANOMALY | X: | 8 | mm/sec | 9.8 | mm/sec² | | X: | 5 | mm/sec | 4.8 | mm/sec² |
| | Y: | 8 | mm/sec | 9.8 | mm/sec² | | Y: | 5 | mm/sec | 4.8 | mm/sec² |
| | Z: | 3 | mm/sec | 0.8 | mm/sec² | | Z: | 5 | mm/sec | 4.8 | mm/sec² |

OK 52

| | SUBSTRATE HOLDING DEVICE | SUBSTRATE TRANSPORT DEVICE | DETERMINATION RESULT |
|---|---|---|---|
| CASE 1 | ○ | ○ | AVAILABLE |
| CASE 2 | ○ | × | NOT AVAILABLE FOR SUBSTRATE STAGE |
| CASE 3 | × | ○ | NOT AVAILABLE FOR SUBSTRATE HOLDING DEVICE |
| CASE 4 | × | × | NOT AVAILABLE FOR SUBSTRATE |

○ : HOLDING SUCCEEDED
× : HOLDING FAILED

SUBSTRATE HOLDING DEVICE, LITHOGRAPHY APPARATUS USING SAME, AND DEVICE MANUFACTURING METHOD

BACKGROUND OF THE INVENTION

1. Field of the Invention

The present invention relates to a substrate holding device, a lithography apparatus using the same, and a device manufacturing method.

2. Description of the Related Art

A semiconductor manufacturing apparatus such as an exposure apparatus exemplified by a lithography apparatus includes a substrate holding device for holding a substrate to be treated. In general, the substrate holding device includes a vacuum adsorption chuck having an adsorption surface for adsorbs and holding a substrate, a vacuum port formed on the chuck, and a pressure sensor that monitors pressure of an exhaust port connected to the vacuum port. In this case, when the measurement value of the pressure sensor indicates any value (vacuum state) after the adsorption of a substrate placed on the chuck, the substrate holding device determines that the substrate is adsorbed and held. On the other hand, when the adsorption of the substrate is stopped and the pressure in the exhaust port is returned to substantially atmospheric pressure, the substrate holding device determines that the substrate-held state is released.

Here, a substrate to be treated may be placed on the chuck with its surface distorted or warped due to thermal treatment or pressure treatment during various manufacturing processes. In addition, an anomaly such as dust attachment, scratch, or the like may occur on the back side of a substrate to be treated (or the resting surface of the chuck). In order to cope with these anomalies, Japanese Patent Laid-Open No. 2004-140071 discloses a substrate holding device that adsorbs a substrate with high accuracy by providing a plurality of pin-like protrusion arrangements on the adsorption surface. Also, Japanese Patent Laid-Open No. 10-70069 discloses a dust detection device that detects the presence or absence of dust and the position of dust, when any dust is present between the substrate and the chuck, so as to clean more intensively based on its detection result. Furthermore, Japanese Patent Laid-Open No. 10-70179 discloses a substrate holding device that reduces the influence of dust on the contacting surface for holding the substrate so as to readily remove dust in the case of dust attachment.

However, the substrate holding device disclosed in Japanese Patent Laid-Open No. 2004-140071 does not disclose any technique for specifying the type and position of the adsorption anomaly. Furthermore, in the device disclosed in Japanese Patent Laid-Open No. 10-70069 and Japanese Patent Laid-Open No. 10-70179, a special device is newly provided for the detection and removal of the adsorption anomaly.

SUMMARY OF THE INVENTION

According to an aspect of the present invention, a substrate holding device for holding a substrate is provided which includes a holding unit that adsorbs and holds the substrate, a measuring section that measures a physical quantity relating to a adsorption force of the holding unit with the substrate mounted on the holding unit, and a control section that selects one of at least three preset operations based on the result of first and second determinations to execute processing depending on the selected operation, wherein the first determination is carried out based on a first condition and a measurement result obtained by the measuring section, and the second determination is carried out based on a second condition that is different from the first condition and a measurement result obtained by the measuring section.

Further features of the present invention will become apparent from the following description of exemplary embodiments with reference to the attached drawings.

BRIEF DESCRIPTION OF THE DRAWINGS

FIG. 8B is a schematic diagram illustrating an exemplary setting screen to be displayed on a console section.

DESCRIPTION OF THE EMBODIMENTS

Hereinafter, preferred embodiments of the present invention will now be described with reference to the accompanying drawings.

First Embodiment

Figure 1:
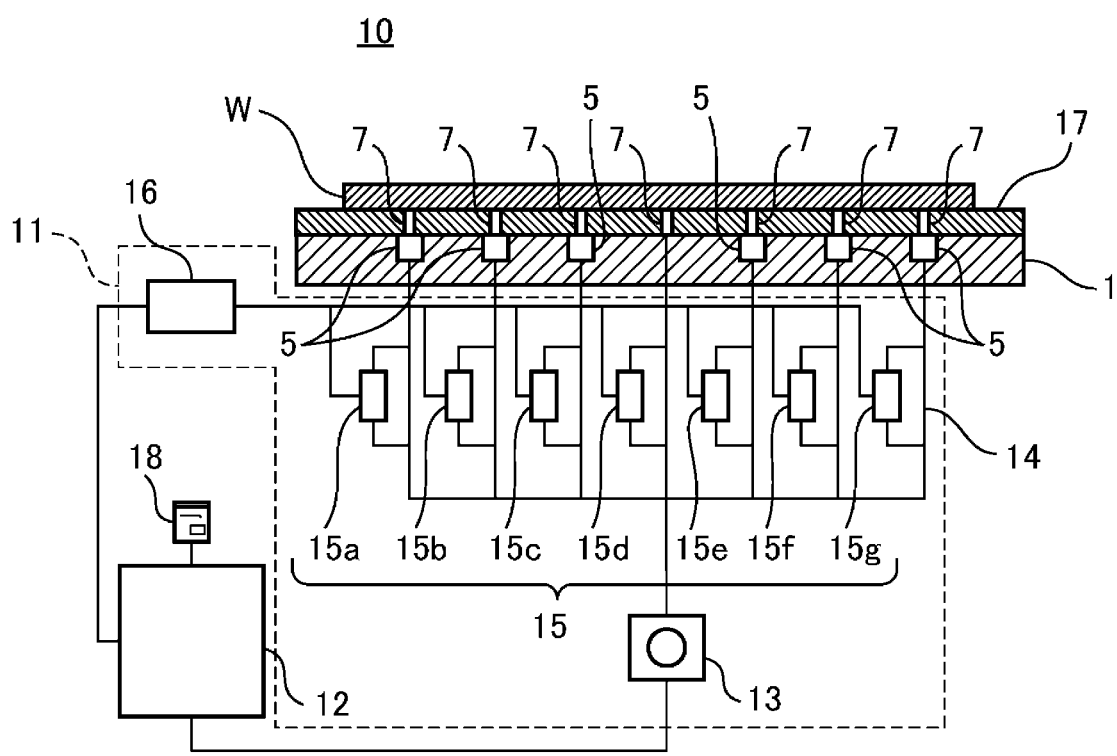
FIG. 1 is a schematic diagram illustrating a configuration of a substrate holding device according to a first embodiment of the present invention.

The configuration of the substrate holding device according to the first embodiment of the present invention will now be described. FIG. 1 is a schematic diagram illustrating the configuration of the substrate holding device. A substrate holding device 10 includes a chuck body (body) 1 having a holding surface for holding a wafer (substrate) W, a vacuum evacuation system 11 for imparting a adsorption force to the wafer W mounted on the chuck body 1, and a main control section 12 that controls the overall apparatus (e.g., exposure apparatus, etc.) in which the substrate holding device 10 are provided. In the present embodiment, the substrate holding device 10 is applied to a stage device that moves the wafer W in an exposure apparatus, and the main control section 12 controls the overall exposure apparatus.

Figure 2A:
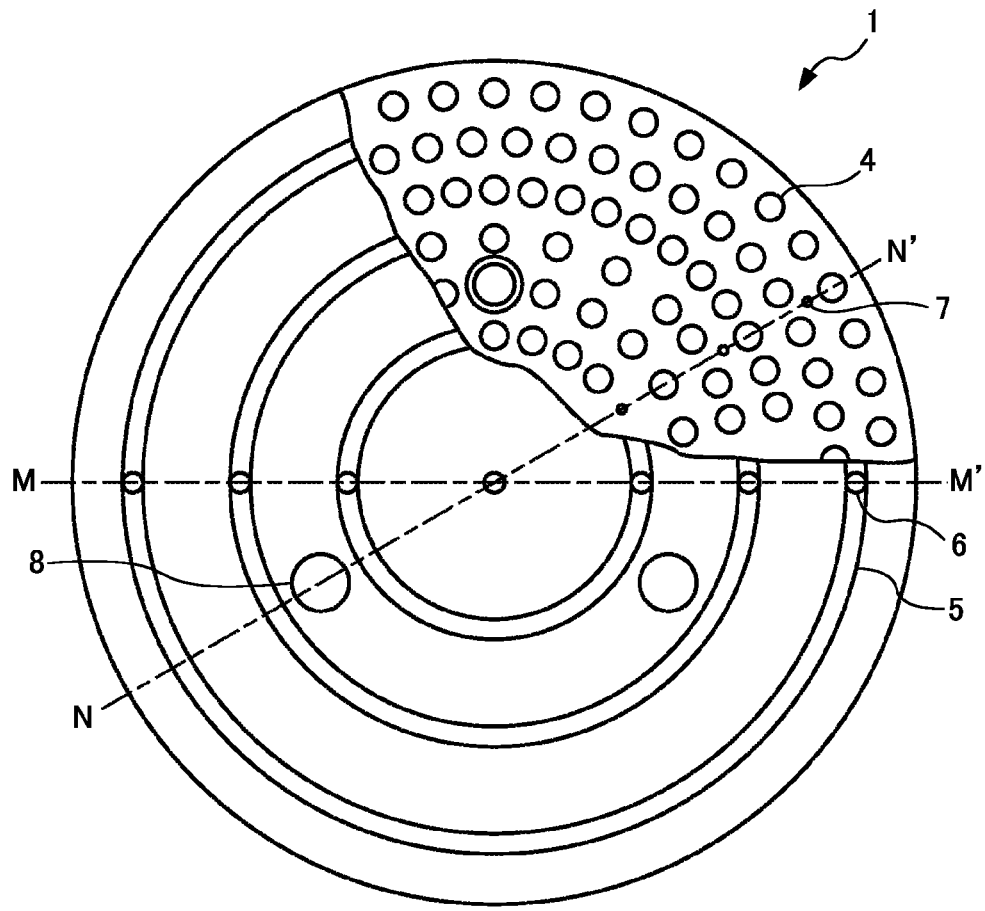
FIG. 2A is a schematic diagram illustrating a structure of a chuck body according to a first embodiment of the present invention.
Figure 2B:
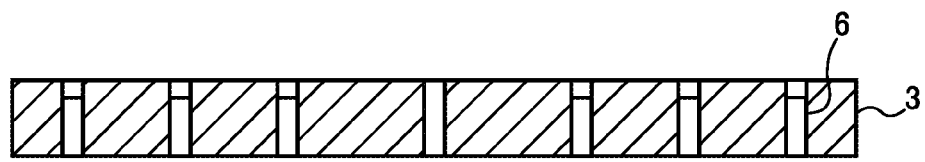
FIG. 2B is a schematic diagram illustrating a structure of a chuck body according to a first embodiment of the present invention.
Figure 2C:
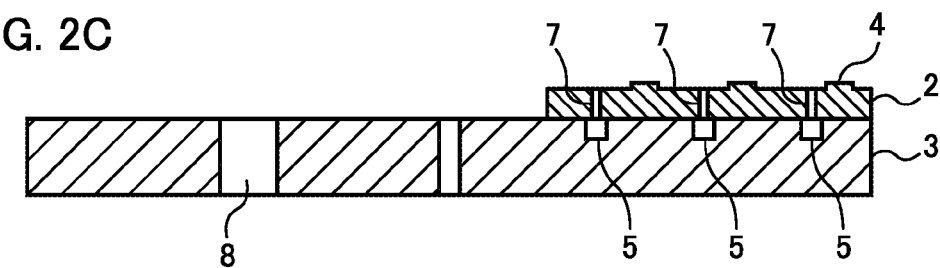
FIG. 2C is a schematic diagram illustrating a structure of a chuck body according to a first embodiment of the present invention.

FIGS. 2A to 2C are schematic diagrams illustrating the structure of the chuck body 1. FIG. 2A is a plan view of the chuck body 1. FIG. 2B is a cross-sectional view taken along line M-M' of FIG. 2A. FIG. 2C is a cross-sectional view taken along line N-N' of FIG. 2A.

The chuck body 1 is composed of a first layer 2 on which a wafer W is placed and a second layer 3 disposed below the first layer 2. It should be noted that FIG. 2A is a partially cutout view of the chuck body 1 for purposes of explanation and FIGS. 2B and 2C illustrate the shape of the flat section of the first layer 2 and the second layer 3. For both of the first layer 2 and the second layer 3, the material exhibiting an excellent thermal conductivity is employed. For example, a sintered SiC ceramic is preferable. Also, the first layer 2 and the second layer 3 are adhered with each other by various adhesion methods.

The first layer 2 has a plurality of protrusions 4, which are formed by an etching process, on the holding surface side for holding the wafer W. Various ways for the arrangement of the protrusions 4, including, but not limited to, a rectangular grid, zigzag grid, or concentrical circumference, are contemplated. However, it is desirable that the spacing (pitch) between the protrusions 4 does not cause any deformation of the wafer W due to subduction of the wafer W upon holing thereof.

The second layer 3 has a plurality of annular grooves 5 on the surface in contact with the first layer 2. Although the number of the grooves 5 will be described later, it is desirable that as many as three uniformly-spaced grooves be provided as shown in FIG. 2A in order to measure vacuum pressure at each section of the wafer W that is placed on the chuck body 1. In addition, as shown in FIG. 2B, the groove 5 is provided with seven exhaust ports 6 extending through the lower surface of the second layer 3. As shown in the M-M' section in FIG. 2A, it is desirable that the exhaust ports 6 be arranged in a single line and in a uniform manner. It should be noted that in the central portion of the second layer 3, a groove is not formed but an exhaust port only is provided. Furthermore, the first layer 2 is provided with seven vacuum ports 7 extending therethrough, which correspond to the positions of the exhaust ports of the grooves 5 and the central portion of the first layer 2. As shown in the N-N' section in FIG. 2A, it is desirable that the vacuum ports 7 be arranged in a single line and in a uniform manner. It should be noted that the installation number of the grooves 5, the installation number of the exhaust ports 6, and the installation number of the vacuum ports 7 in the single groove 5 are not particularly limited. In particular, the installation number of the vacuum ports 7 in the single groove 5 may be two or more in a single line at a minimum.

Furthermore, the chuck body 1 is provided with three through holes 8 for inserting a lift pin (not shown) that performs vertical movement in order to lift the wafer W up from the surface of the chuck body 1 upon placing the wafer W. In general, the placement of the wafer W on the chuck body 1 is implemented such that a substrate transport device 82 to be described below places the wafer W on the lift pin and the lift pin is then lowered.

The vacuum evacuation system 11 includes a vacuum pump 13, and vacuum evacuation lines 14 that connect the vacuum pump 13 with each of the respective exhaust ports 6 provided in the chuck body 1. The vacuum pump 13 is an exhaust unit that exhausts so as to hold the wafer W placed on the chuck body 1 by vacuum adsorption. While in the present embodiment, the vacuum evacuation lines 14 are connected only to the chuck body 1 for convenience of explanation, the vacuum evacuation lines 14 may be connected to another vacuum evacuation lines. In this manner, the substrate holding device 10 of the present embodiment includes a holding unit constituted by the chuck body 1, the vacuum evacuation lines 14, and the vacuum pump 13. In addition, the vacuum evacuation system 11 includes pressure sensors 15 (15a to 15g), each of which is provided in each of a plurality of vacuum evacuation lines 14. Furthermore, the vacuum evacuation system 11 includes a pressure information control section 16 that manages the measurement results obtained by each of the pressure sensors 15.

Each of the pressure sensors 15a to 15g is a measuring section that measures each of the pressure values of the vacuum evacuation lines 14. While in the present embodiment, each of the pressure sensors 15 is provided in each of the vacuum evacuation lines 14, the installation number of the pressure sensors may be less than seven if the pressure values corresponding to a plurality of the vacuum evacuation lines 14 can be measured with a single pressure sensor.

The pressure information control section 16 is an information control section that manages pressure information including measurement results measured by the pressure sensors 15a to 15g. Here, the term "pressure information" as used herein refers to data including at least either one of pressure values measured by the pressure sensors 15, and the change amount or the change rate of the pressure measurement value that changes over time. In addition, the pressure information control section 16 successively monitors the pressure information on the pressure sensors 15 as well as transmits the pressure information to the main control section 12.

The main control section 12 is a control section that controls the adsorption operation of the substrate holding device 10, controls the vacuum pump 13 and the pressure information control section 16 that are provided in the vacuum evacuation system 11, and further controls the overall system in which the substrate holding device 10 is provided. The main control section 12 is composed of a computer including various operation programs, a sequencer, or the like. The main control section 12 transmits operational instructions to the vacuum pump 13, the pressure information control section 16, and the like that are connected via a LAN cable. Furthermore, the main control section 12 can store the pressure information, which is transmitted from the pressure information control section 16, in the storage device such as a memory installed therein and can appropriately read the pressure information of the past (history information). While in the present embodiment the pressure information control section 16 is separately provided from the main control section 12, a single control section may have both functions.

Furthermore, the main control section 12 is connected to a console section 18 that plays a role as interface between an operator and the main control section 12. The console section 18 includes a display device and an input device. By means of the console section 18, the operator inputs various setting values (parameter values) and the operation contents of the overall apparatus and provides operational instructions of the apparatus. In addition, the console section 18 displays the operation status of the overall apparatus, the presence or absence of the wafer W placed on the chuck body 1, as well as an error when any trouble occurs on the apparatus so as to appropriately report the operation status of the apparatus to an operator.

Figure 3:
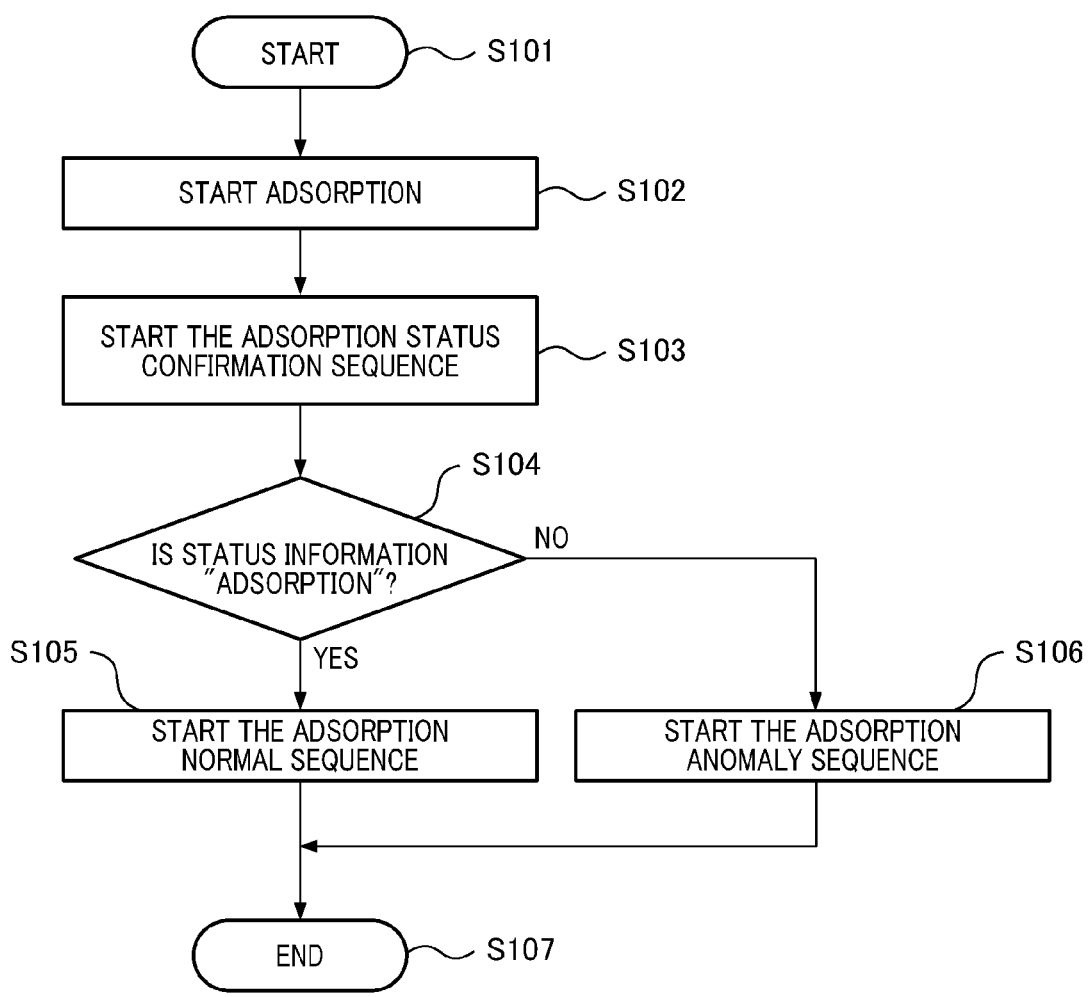
FIG. 3 is a flowchart showing the flow of overall processing in the substrate holding device of the present invention.

Next, processing performed by the substrate holding device will be described with reference to flowchart illustrations. FIG. 3 is a flowchart showing the overall flow of processing in the case where the adsorption is completed or the adsorption is not completed after the substrate holding device 10 starts the adsorption operation.

First, after the wafer W is placed on the chuck body 1, the main control section 12 starts the following sequence (step S101). Next, the main control section 12 drives the vacuum pump 13 to start the adsorption of the wafer W (step S102).

Figure 4:
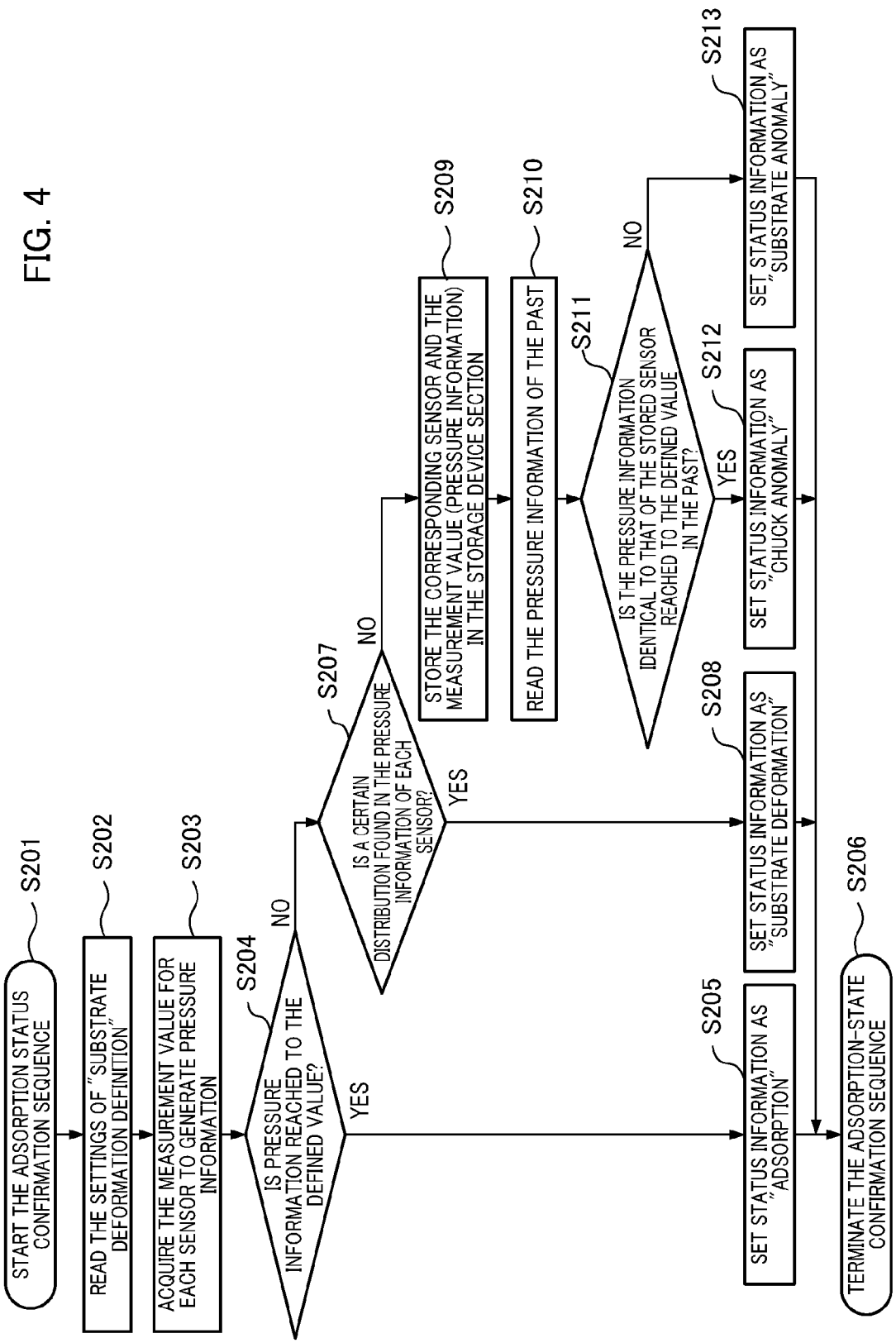
FIG. 4 is a flowchart showing the flow of the adsorption confirmation sequence according to a first embodiment of the present invention.

Next, the main control section 12 executes the adsorption confirmation sequence (step S103). The adsorption confirmation sequence will be described in detail with reference to FIG. 4 shown below. In the adsorption confirmation sequence, the status information of the wafer W is classified in four types: "adsorption", "substrate deformation", "chuck anomaly", and "substrate anomaly" on the basis of pressure information. For convenience of explanation of the present invention, the term "status information" as used herein refers to information regarding the holding state of the wafer W. The term "adsorption" as used herein refers to the state in which the adsorption is successfully completed. The term "substrate deformation" as used herein refers to the state in which the wafer W is deformed. The term "chuck anomaly" as used herein refers to the state that there is an anomaly in the substrate holding apparatus. Such chuck anomaly includes, for example, the case where a dust or a scratch occurs on the holding surface 17 of the chuck body 1, the case where there is an anomaly in the pressure information control section 16, or the like. Furthermore, the term "substrate anomaly" as used herein refers to the state that there is an anomaly in the wafer W. Such substrate anomaly includes, for example, the case where a dust or a scratch occurs on the holding surface 17 of the wafer W. In this way, the main control section 12 determines the presence or absence of the adsorption anomaly, and further specifies the cause of the anomaly if there is the adsorption anomaly.

Next, the main control section 12 determines whether or not status information is "adsorption" based on the determination of the adsorption confirmation sequence in step S103 (step S104). Here, if it is determined that status information is "adsorption" (Yes in step S104), the main control section 12 starts the adsorption normal sequence (step S105). The term "adsorption normal sequence" as used herein refers to normal processing performed by the main control section 12 as the substrate holding device and the entire apparatus. For example, when the substrate holding device is applied to the stage device of the exposure apparatus, exposure processing or measurement processing for the exposure is executed in the adsorption normal sequence. Then, the main control section 12 terminates processing (step S107).

Figure 7:
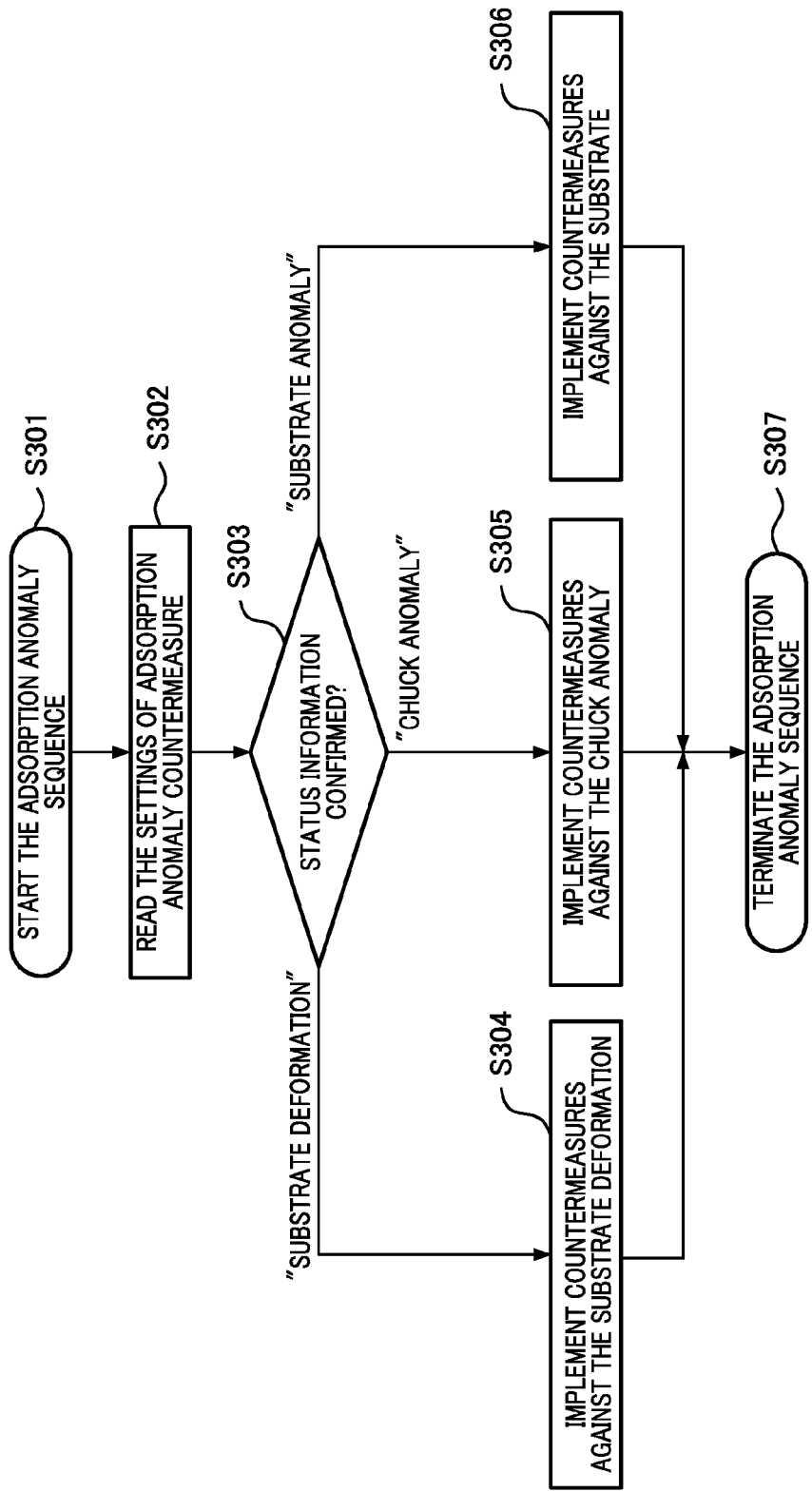
FIG. 7 is a flowchart showing the flow of the adsorption anomaly sequence according to a first embodiment of the present invention.

On the other hand, if it is determined that status information is not "adsorption" in the determination of the adsorption confirmation sequence in step S104 (No in step S104), the main control section 12 starts the adsorption anomaly sequence (step S106). The adsorption anomaly sequence will be described in detail with reference to FIG. 7 shown below. Then, the main control section 12 terminates processing (step S107).

Next, the adsorption confirmation sequence (step S103) will now be described. FIG. 4 is a flowchart showing the flow of the adsorption confirmation sequence.

First, the main control section 12 starts the adsorption confirmation sequence (step S201), and reads the settings of "substrate deformation definition" set by the operator by means of the console section 18 from the internal storage device (step S202). In this case, the main control section 12 reads either one of or both of the following two definitions (determination condition) that are previously stored on the internal storage device. The first definition is a definition that "if the measurement value of the pressure sensors 15 (e.g., the pressure sensors 15a and 15g) corresponding to the outer periphery of the holding surface (or the wafer W) among a plurality of the pressure sensors 15 connected to the chuck body 1 does not satisfy the defined value, it is determined that the outer periphery of the wafer W is warped". The second definition is a definition that "if the measurement value of the pressure sensor 15 (e.g., the pressure sensor 15d) corresponding to the central portion of the holding surface (or the wafer W) among a plurality of the pressure sensors 15 does not satisfy the defined value, it is determined that the central portion of the wafer W is bulged".

Next, the main control section 12 causes the pressure information control section 16 to acquire the measurement value for each of the pressure sensors 15a to 15g at any time interval, and further causes the pressure information control section 16 to generate their respective pressure information to thereby receive pressure information from the pressure information control section 16 (step S203). It should be noted that the main control section 12 may cause the pressure information control section 16 to generate the pressure information with one-time measurement without any definite time interval in order to reduce determination time.

Next, the main control section 12 determines whether or not the pressure information is reached to the defined value (whether or not the first condition is satisfied) based on the pressure information that has been obtained in step S203 (step S204). In this case, the terms "whether or not the pressure information is reached to the defined value" means whether or not the first condition is satisfied. Here, for the defined value that defines "adsorption", it is assumed in the present embodiment that the wafer W is properly adsorbed on the chuck body 1, if the measurement values (pressure information) for all of the pressure sensors 15 indicate pressure equal to or less than a predetermined pressure after any time (e.g., after three seconds).

Next, first, as a first pattern, assume that it is determined that the transported wafer W is properly adsorbed (Yes in step S204). In this case, the main control section 12 defines status information as "adsorption" (step S205). Then, the main control section 12 terminates the adsorption confirmation sequence (step S206). It should be noted that there is a number of defined values that define as adsorption in addition to the one described above and the present invention is not particularly limited thereto.

On the other hand, if the pressure information has not been reached to the defined value of adsorption in step S204 (No in step S204), the main control section 12 determines whether or not there is a predetermined distribution in accordance with the substrate deformation definition that has been read in step S202 in each of the pressure information (whether or not the second condition is satisfied) (step S207). In this case, the terms "whether or not there is a predetermined distribution in each of the pressure information" means whether or not the second condition is satisfied.

Figure 5A:
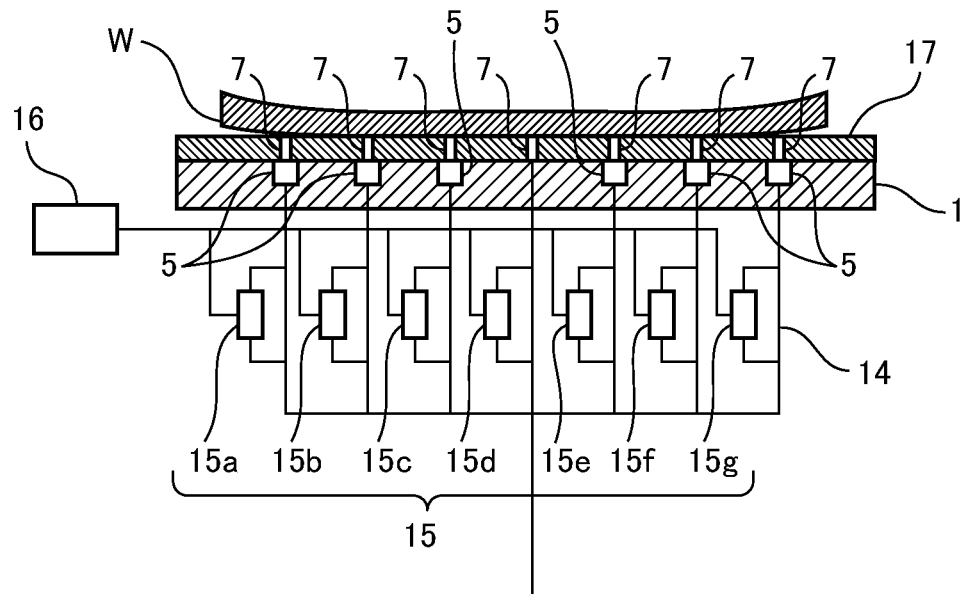
FIG. 5A is a schematic diagram illustrating a substrate holding device on which a warped substrate is placed.
Figure 5B:
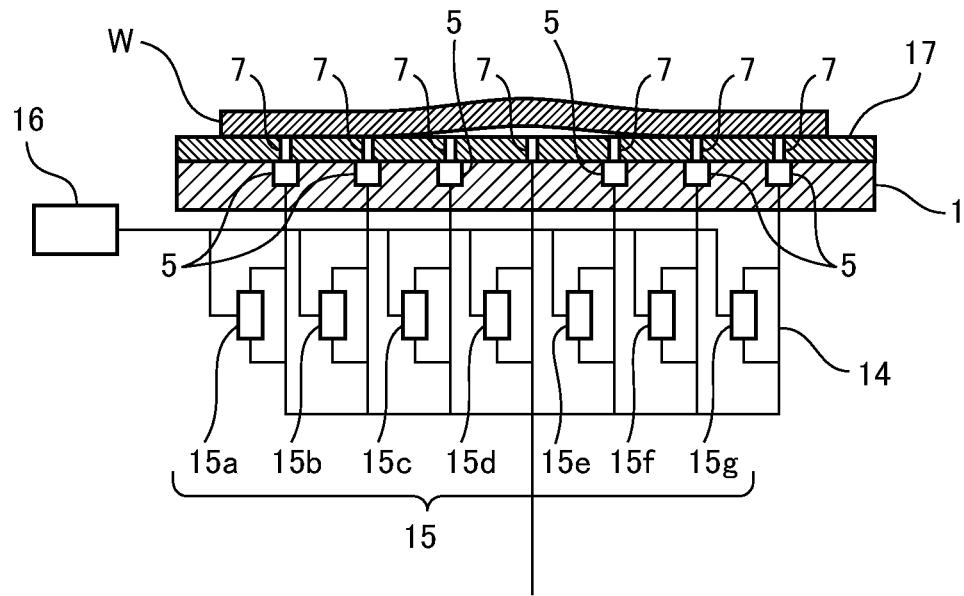
FIG. 5B is a schematic diagram illustrating a substrate holding device on which a substrate is placed with its central portion being bulged upward.

Next, as a second pattern, assume that it has been determined in step S207 that "there is a predetermined distribution (i.e., distribution exceeds a predetermined range)" in accordance with the substrate deformation definition in each of the pressure information (Yes in step S207). Here, the term "there is a predetermined distribution" as used herein refers to, for example, the case where the pressure information of only the two pressure sensors 15a and 15g provided at the outer periphery of the chuck body 1 does not satisfy the defined value. In this case, this corresponds to the first definition described above. Hence, the shape of the wafer W is warped upward as shown in FIG. 5A, whereby it is inferred that the pressure information shown by the pressure sensor 15 provided at the outer periphery of the chuck body 1 could not satisfy the defined value. Likewise, it can be considered the case where the pressure information of only the three pressure sensors 15c, 15d, and 15e provided at the central portion of the chuck body 1 does not satisfy the defined value. In other words, in this case, this confirms with the second definition and it is inferred that the shape of the central portion of the wafer W is bulged upward as shown in FIG. 5B. For the second pattern, the main control section 12 defines status information as "substrate deformation" (step S208). Then, the main control section 12 terminates the adsorption confirmation sequence (step S206).

On the other hand, assume that it has been determined in step S207 that "a predetermined distribution is not found (i.e., distribution falls within a predetermined range)" in accordance with the substrate deformation definition in each of the pressure information (No in step S207). Here, the term "a predetermined distribution is not found" as used herein refers to, for example, the case where all of the pressure sensors do not satisfy the defined value. The aforementioned term also refers to, for example, the case where in the pressure information of the pressure sensors 15a and 15g provided near the outer periphery of the chuck body 1, the pressure information of the pressure sensor 15a does not satisfy the defined value whereas that of the pressure sensor 15g satisfies the defined value. In this case, the main control section 12 stores the pressure sensor that does not satisfy the defined value and the pressure information shown by the pressure sensor in the internal storage device (step S209).

Next, the main control section 12 reads the pressure information of the past that is stored in the internal storage device (step S210) so as to determine (the third determination) whether or not the pressure information of the past of the pressure sensor, which does not satisfy the defined value, has been reached to the defined value (step S211).

Figure 6A:
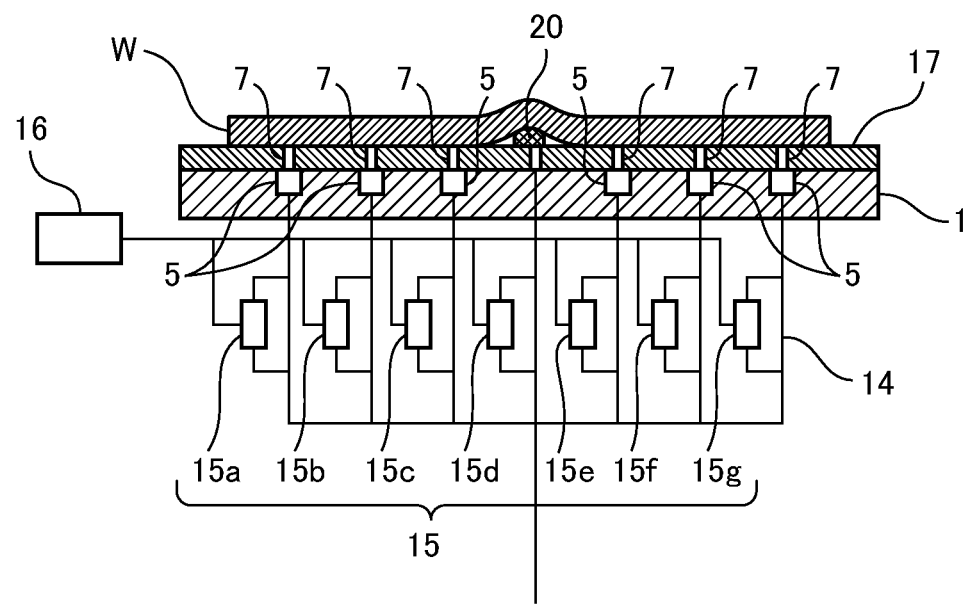
FIG. 6A is a schematic diagram illustrating a substrate holding device on which a deformed substrate is placed, when a cause for preventing any pressure increase occurs on a substrate holding device.

Next, as a third pattern, assume that it has been determined in step S211 that the pressure information of the identical pressure sensors 15 has not satisfied the defined value in the past (Yes in step S211). In this case, the pressure information of the identical pressure sensor again does not satisfy the defined value. Hence, as shown in FIG. 6A, it is inferred that a cause for preventing any pressure increase (e.g., the attachment of a dust 20 to the holding surface 17) occurs on the substrate holding device. For the third pattern, the main control section 12 defines status information as "chuck anomaly" (step S212). Then, the main control section 12 terminates the adsorption confirmation sequence (step S206).

Figure 6B:
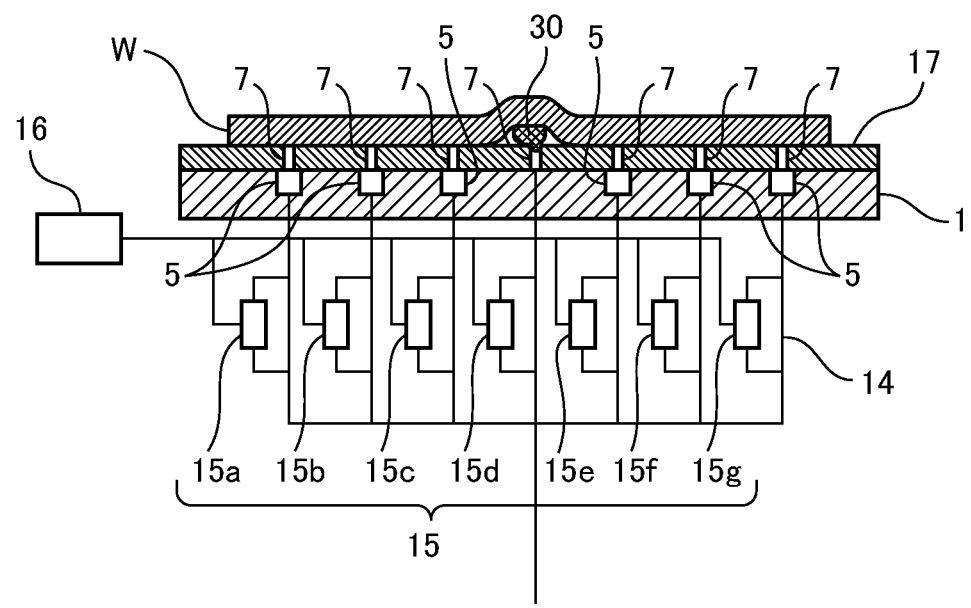
FIG. 6B is a schematic diagram illustrating a substrate holding device on which a deformed substrate is placed, when a cause for preventing any pressure increase occurs on the substrate.

On the other hand, as a fourth pattern, assume that it has been determined in step S211 that the pressure information of the identical pressure sensor has satisfied the defined value in the past (No in step S211). In this case, as shown in FIG. 6B, it is inferred that a cause for preventing any pressure increase (e.g., the attachment of a dust 30 to the back surface of the wafer W) occurs on the wafer W. For the fourth pattern, the main control section 12 defines status information as "substrate anomaly" (step S213). Then, the main control section 12 terminates the adsorption confirmation sequence (step S206).

It should be noted that in the third and fourth patterns, the main control section 12 can also determine status information as "chuck anomaly" if adsorption has been failed three times when five wafers have been transported, for example. In other words, the present invention is applicable without dependence on the sorting process if an algorithm can sort out "chuck anomaly" and "substrate anomaly".

Figure 16A:
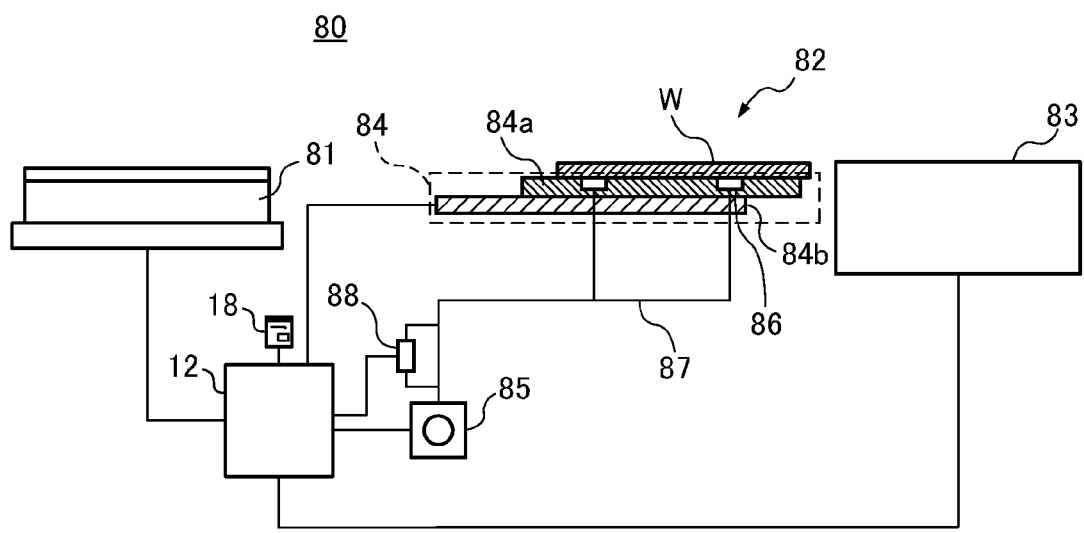
FIG. 16A is a schematic view illustrating a configuration of a substrate transport apparatus according to an embodiment of the present invention.

When a new wafer, which has no past pressure information, is placed on the chuck body 1, the main control section 12 may determine that there is an anomaly on the substrate in spite of the fact that a cause for preventing adsorption actually lies in the substrate holding device. In this case, after a new wafer is once retracted to a substrate stocker 83 as shown in FIG. 16A to be described later so as to confirm status information that has been determined by the adsorption confirmation sequence of a wafer to be processed subsequently, the main control section 12 may apply the algorithm for determining status information of the initial wafer. For example, when status information of the second wafer is "adsorption", "substrate deformation", or "substrate anomaly", it is believed that the anomaly of the initial wafer is "substrate anomaly". On the other hand, when status information of the second wafer is "chuck anomaly", it is believed that the anomaly of the initial wafer is also "chuck anomaly". It should be noted that the substrate stocker 83 is a storing apparatus that temporarily stores a plurality of wafers. In this case, a substrate transport system 82 transfers a wafer between the substrate holding device 10 and the substrate stocker 83. As described above, in the present embodiment, the adsorption confirmation sequence shown in FIG. 4 classifies the status information of the wafer W placed on the chuck body 1 into either one of: "adsorption", "substrate deformation", "chuck anomaly", and "substrate anomaly". The main control section 12 displays the status information on the console section 18 so as to notify the status of the chuck body 1 or the wafer W to an operator.

Next, the adsorption anomaly sequence (step S106) will now be described. FIG. 7 is a flowchart showing the flow of the adsorption anomaly sequence.

First, the main control section 12 starts the adsorption anomaly sequence (step S301), and reads the settings: "substrate deformation countermeasure", "chuck anomaly countermeasure", and "substrate's back side anomaly countermeasure", which have been set by an operator using the console section 18, from the internal storage device (step S302). In this case, for the settings of "substrate deformation countermeasure", the main control section 12 reads the process contents for executing processing in the same manner as that under normal condition at stage velocity or stage acceleration, which is different from the normal condition, in the event of an anomaly, for example. Likewise, for the settings of "chuck anomaly countermeasure", the main control section 12 reads the process contents for performing dust removal processing for the holding surface of the chuck body, for example. Furthermore, for the settings of "substrate's back side anomaly countermeasure", the main control section 12 reads the process contents for transferring the wafer of interest to the substrate stocker 83, for example.

Next, the main control section 12 confirms which status information (steps S208, S212, and S213 in FIG. 4) is (step S303).

Next, in step S303, when status information is "substrate deformation", the main control section 12 performs restoration processing of the substrate deformation countermeasure, which have been read in step S302, with respect to the wafer W (step S304).

On the other hand, in step S303, when status information is "chuck anomaly", the main control section 12 performs restoration processing of the chuck anomaly countermeasure that have been read in step S302 (step S305).

Alternatively, in step S303, when status information is "substrate anomaly", the main control section 12 performs restoration processing of the substrate's back side anomaly countermeasure, which have been read in step S302, with respect to the wafer W (step S306). As described above, the main control section 12 selects one of a plurality of preset operations to execute processing depending on the selected operation.

After the respective countermeasure processing is completed, the main control section 12 terminates the adsorption anomaly sequence (step S307). It should be noted that the respective restoration processing contents to be set in step S302 can be selected as appropriate and should not particularly be limited. When the process contents are changed, such change can be made by previously setting a desired countermeasure method at the console section 18. As described above, in the present embodiment, restoration processing from the respective anomaly statuses can be carried out by the adsorption anomaly sequence and the wafer W's status information as shown in FIG. 7. The restoration processing is automatically performed by the main control section 12, whereby an operation via an operator is avoided. The main control section 12 displays the currently-performing restoration processing or the history of performed restoration processing on the console section 18 so as to notify the completion of restoration processing to the operator.

Figure 8A:
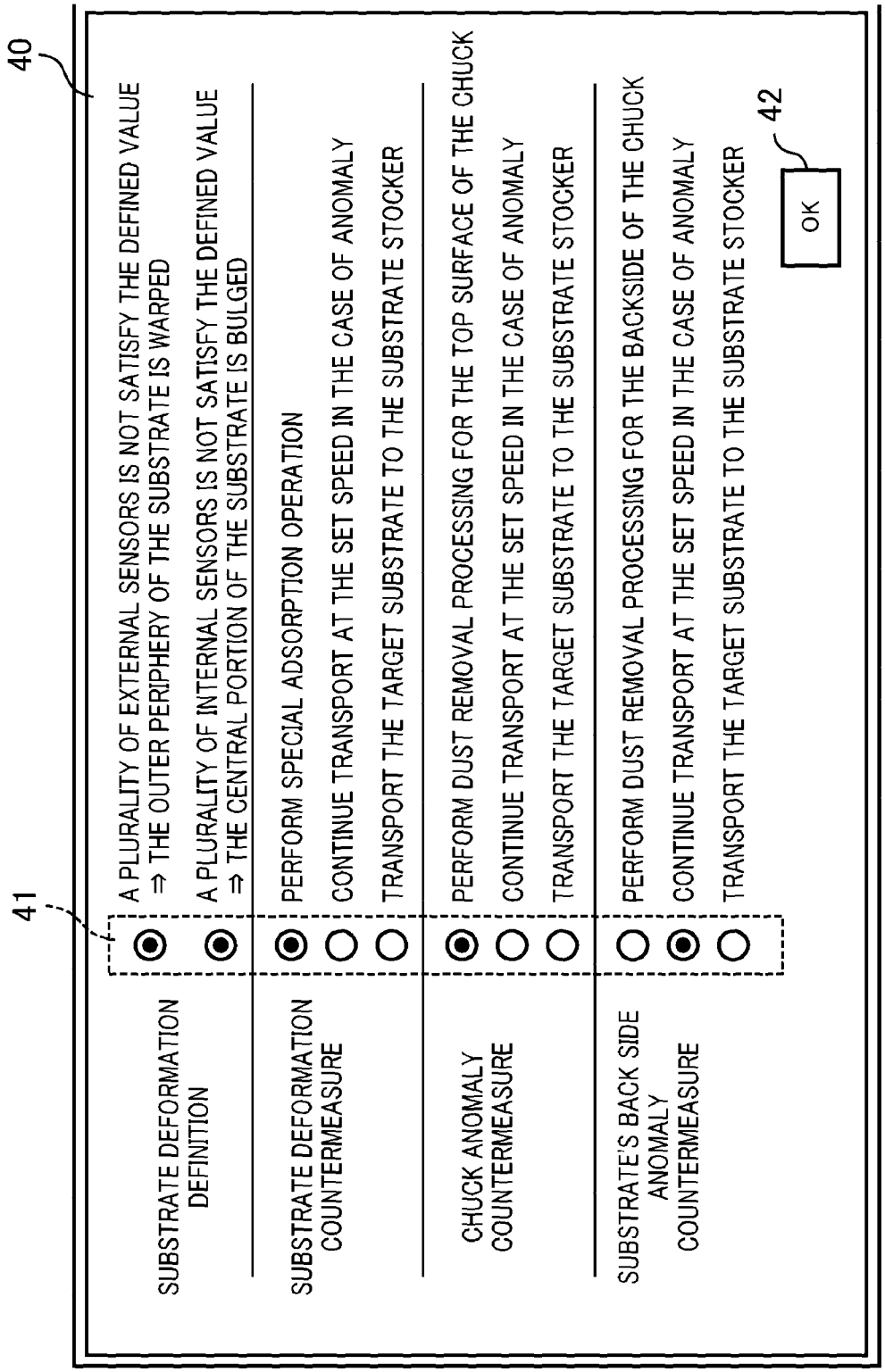
FIG. 8A is a schematic diagram illustrating an exemplary setting screen to be displayed on a console section.

Next, the setting screen to be displayed on the console section 18 will now be described. FIG. 8A is an example of the setting screen to be displayed on the console section 18. Furthermore, FIG. 8B is an example of the setting screen, regarding to a speed/acceleration of the stage apparatus (the substrate stage) to which the substrate holding device is applied, to be displayed on the console section 18.

An operation setting display section 40 shown in FIG. 8A is a setting screen for setting the operation contents of the adsorption confirmation performed by the substrate holding device 10. In the operation setting display section 40, "substrate deformation definition" is a display field for selecting the settings of the definition that defines a substrate deformation. "Substrate deformation countermeasure" is a display field that sets (selects) a countermeasure method if the wafer W is deformed when the adsorption of the wafer W is started. "Chuck anomaly countermeasure" is a display field that sets a countermeasure method if there is an anomaly in the substrate holding device when the adsorption of the wafer is started. Furthermore, "substrate's back side anomaly countermeasure" is a display field that sets a countermeasure method if there is an anomaly on the back side of the wafer W when the adsorption of the wafer W is started.

A toggle button 41 is a button that selects the settings. In this example, a plurality of the toggle buttons 41 can be selected for the substrate deformation definition, but only one toggle button 41 can be selected for the settings of other countermeasure processing. Also, a determination button 42 is a button that determines the settings selected by the toggle button 41 so as to bring them to the main control section 12. It should be noted that when the setting of "the transport is continued at the set speed in the case of the anomaly" is selected at the operation setting display section 40, the wafer transport is continued in accordance with the settings of the speed/acceleration that have been set on the setting screen shown in FIG. 8B.

In FIG. 8B, the setting display section 50 is a setting screen for setting the speed/acceleration of the stage apparatus to which the substrate holding device is applied in the case of the states of "under normal condition (upon adsorption)", "substrate deformation countermeasure", "chuck anomaly countermeasure", and "substrate's back side anomaly countermeasure". Likewise, the setting display section 51 is a setting screen for setting the speed/acceleration of the transport hand of the substrate transport device in the case of the states of "under normal condition (upon adsorption)", "substrate deformation countermeasure", "chuck anomaly countermeasure", and "substrate's back side anomaly countermeasure". A determination button 52 is a button that determines the settings of the speed/acceleration at the setting display section 50 of the substrate holding device and the setting the speed/acceleration at the display section 51 of the substrate transport device so as to bring them to the main control section 12. Here, in general, the speed/acceleration setting values in the case of the occurrence of the adsorption anomaly are lowered so as not to cause a drop of the wafer W, since the adsorption force (holding force) of the wafer W decreases compared to that in the case of normal adsorption. While in the present embodiment, speed/acceleration is previously and uniquely defined depending on the state of the wafer W, the present invention is not limited thereto. For example, the relationship between the adsorption (pressure) force and the speed/acceleration may be represented in the form of a formula. The main control section 12 may hold the wafer W based on the formula so as to automatically determine the speed/acceleration.

As can be understood from the description above, in accordance with the present embodiment, when a adsorption anomaly of a substrate occurs, a plurality of pressure sensors is used so as to refer to pressure information at a plurality of different substrate positions, whereby the causes of the adsorption anomaly can be precisely and immediately determined. Also, by previously setting the restoration processing method corresponding to the respective adsorption anomalies, restoration processing can be performed immediately after the adsorption anomaly occurs, resulting in the reduction of down time for the entire apparatus (exposure apparatus, etc.). Furthermore, the adsorption anomaly can be immediately restored, which leads to an increase in the degree of freedom for appropriately setting a moving speed to a desired speed without delaying the transporting speed of the substrate. In addition, a large-scaled anomaly detection apparatus is not required, and thereby it is advantageous in terms of costs and space.

While in the present embodiment the pressure in the holding unit is measured with the pressure sensor, the present invention is not limited thereto. A measuring section that measures a physical quantity relating to an adsorption force of the holding unit needs to be provided. An embodiment in which the other sensor other than the pressure sensor is employed as the measuring section will be described below.

In the present embodiment, the main control section carries out a first determination based on a first condition and a measurement result obtained by the pressure sensor and a second determination based on a second condition that is different from the first condition and a measurement result obtained by the pressure sensor. Here, the first condition is whether or not the measured pressure (negative pressure) exceeds a predetermined value, whereas the second condition is whether or not the distribution range of the pressure measured at a plurality of locations exceeds a predetermined range. In such cases, while the main control section of the present embodiment carries out determination based on the second condition if the first condition is not satisfied in the first determination, the main control section of the present embodiment may simultaneously carry out the first determination and the second determination to execute processing depending on the combinations of these results.

Furthermore, in the present embodiment, the main control section selects one of at least three preset operations based on the results of the first determination and the second determination to execute processing depending on the selected operation. Here, the preset operations listed herein include four countermeasures: "adsorption normal sequence", "countermeasure to a substrate deformation", "countermeasure to a chuck", and "countermeasure to a substrate". For example, the preset operations may be three countermeasures: "adsorption normal sequence", "countermeasure to a substrate deformation", and "countermeasure to a chuck or a substrate (countermeasure to an anomaly not caused by the deformation of a substrate)".

Second Embodiment

Figure 9:
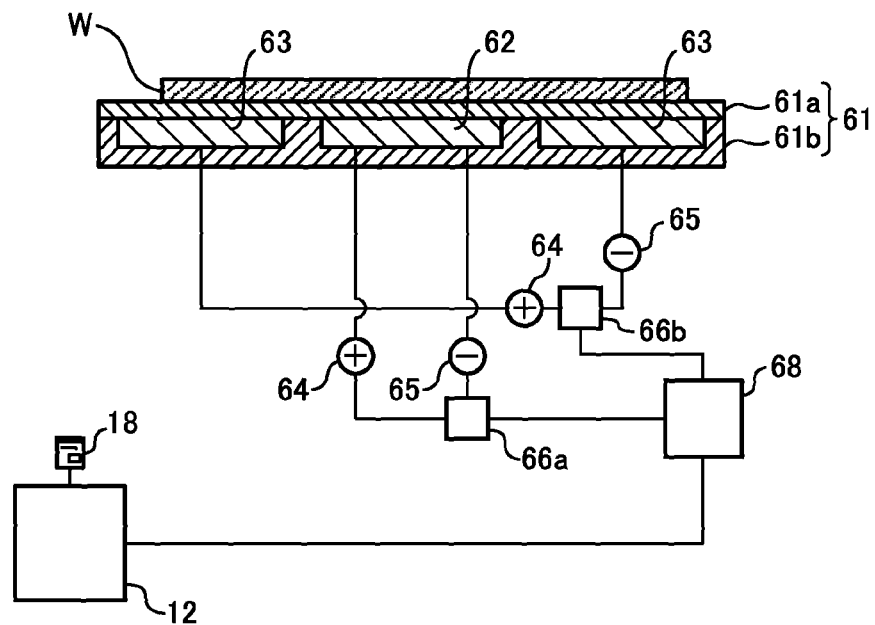
FIG. 9 is a schematic diagram illustrating a configuration of a substrate holding device according to a second embodiment of the present invention.

Next, a substrate holding device according to a second embodiment will now be described. FIG. 9 is a schematic diagram illustrating a configuration of a substrate holding device according to a second embodiment of the present invention. In FIG. 9, the same elements as those shown in FIG. 1 are designated by the same reference numerals and explanation thereof will be omitted. A substrate holding device 60 of the present embodiment is characterized in that instead of a vacuum adsorption method using a vacuum evacuation system, an electrostatic adsorption method using an electrode is employed as a wafer adsorption method.

The substrate holding device 60 includes a chuck body 61 having a holding surface for holding the wafer W, and a plus power supply 64 and a minus power supply 65 that apply a voltage to adsorption sections (electrodes) 62 and 63, respectively, embedded in the chuck body 61. Here, a holding unit is constituted by the chuck body 61 and the power supply 65, and the adsorption sections 62 and 63. Furthermore, the substrate holding device 60 includes voltmeters 66a and 66b that measure voltage values applied to the adsorption sections 62 and 63, respectively, and a voltage information control section 68 that manages voltage information. Here, the "voltage information" includes at least either one of a voltage measurement value measured by the voltmeters 66a and 66b, and the change amount or the change rate of the voltage measurement value that changes over time. In addition, the voltage information control section 68 successively monitors the voltage information on the voltmeters 66a and 66b as well as transmits the voltage information to the main control section 12.

The chuck body 61 is a disk-like member that is composed of a dielectric layer 61a that is the resting surface of the wafer W, and an insulating layer 61b located below the dielectric layer 61a. Furthermore, with respect to the resting surface of the wafer W, a disk-like first adsorption section 62 for performing the adsorption of the central portion, and a circular second adsorption section 63 disposed to surround the first adsorption section 62 are embedded in the insulating layer 61b. For both materials of the dielectric layer 51a and the insulating layer 61b, the material exhibiting an excellent thermal conductivity is employed. For example, a sintered SiC ceramic is preferable. Also, the dielectric layer 61a and the insulating layer 61b are adhered with each other by various adhesion methods.

Each of the first and second adsorption sections 62 and 63 is an internal electrode that positively and negatively charges the dielectric layer 61a via a voltage to be applied from the positive power supply 64 and the negative power supply 65. When the wafer (conductor) W is brought closer to the charged dielectric layer 61a, a charge of a polarity opposite to that of the dielectric layer 61a (charged material) is collected to the surface facing to the wafer W. An electrostatic adsorption is a adsorption of the wafer W utilizing a coulomb force that attracts the charge of opposite polarity.

The voltmeters 66a and 66b in the substrate holding device 60 corresponds to the pressure sensors 15a to 15g in the substrate holding device 10 of the first embodiment. The substrate holding device 60 produces the same operation and effect as the substrate holding device 10 of the first embodiment. In other words, the main control section 12 appropriately determines the adsorption anomaly of the wafer W on the basis of the voltage information, which is the comparison between the voltage value at the first adsorption section 62 for performing the adsorption of the central portion of the wafer W and the voltage value at the second adsorption section 63 for performing the adsorption of the outer peripheral portion of the wafer W, provided from the voltage information control section 68. While in the present embodiment, the installation number of the voltmeters corresponding to the first adsorption section 62 and the second adsorption section 63 is two, the present invention is not limited thereto. More accurate results can be obtained by increasing the installation number of the voltmeters.

Third Embodiment

Figure 10:
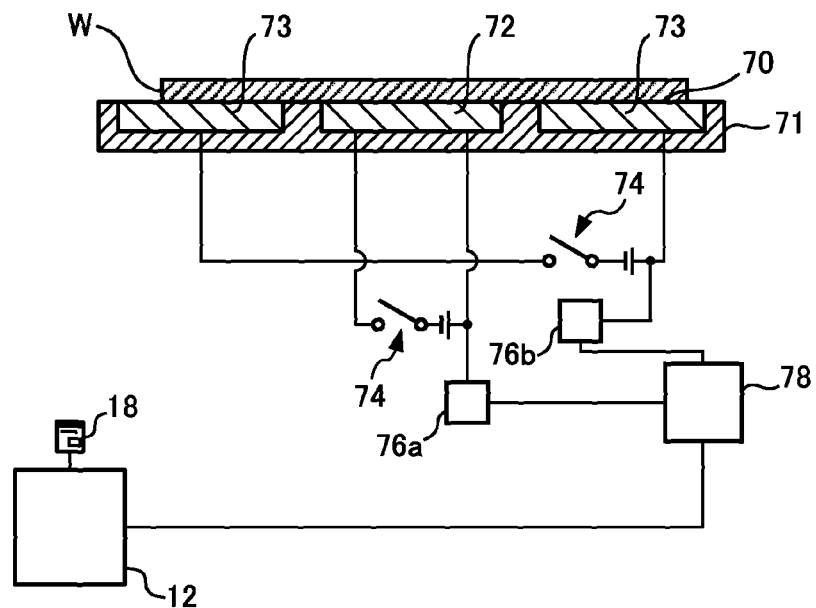
FIG. 10 is a schematic diagram illustrating a configuration of a substrate holding device according to a third embodiment of the present invention.

Next, a substrate holding device according to a third embodiment will now be described. FIG. 10 is a schematic diagram illustrating a configuration of a substrate holding device according to a third embodiment of the present invention. In FIG. 10, the same elements as those shown in FIG. 1 are designated by the same reference numerals and explanation thereof will be omitted. The substrate holding device 70 of the present embodiment is characterized in that instead of a vacuum adsorption method using a vacuum evacuation system, a magnetic adsorption method using a magnet is employed as a wafer adsorption method.

The substrate holding device 70 includes a chuck body 71 having a holding surface for holding the wafer W, and a conducting switch 74 that applies a current to adsorption sections 72 and 73 embedded in the chuck body 71. Here, a holding unit is constituted by the chuck body 71, the adsorption sections 72 and 73, and the conducting switch 74. Furthermore, the substrate holding device 70 includes magnetometers 76a and 76b that measure magnetic force based on each of the current values to be applied to the adsorption sections 72 and 73, and a the magnetic information control section 78 that manages the magnetic information. Here, the "magnetic information" includes at least either one of a magnetic measurement value measured by the magnetometers 76a and 76b, and the change amount or the change rate of the magnetic measurement value that changes over time. In addition, the magnetic information control section 78 successively monitors the magnetic information on the magnetometers 76a and 76b as well as transmits the magnetic information to the main control section 12.

The chuck body 71 is a disk-like member inside which a disk-like first adsorption section 72 for performing the adsorption of the central portion, and a circular second adsorption section 73 disposed to surround the first adsorption section 72 are embedded with respect to the resting surface of the wafer W. For the chuck body 71, the material exhibiting an excellent thermal conductivity is employed. For example, a sintered SiC ceramic is preferable.

Each of the first and the second adsorption sections 72 and 73 is an internal magnet that generates a magnetic force by a current to be applied from a power supply (not shown) via the conducting switch 74. A magnetic adsorption adsorbs the wafer W utilizing the magnetic force.

The magnetometers 76a and 76b in the substrate holding device 70 corresponds to the pressure sensors 15a to 15g in the substrate holding device 10 of the first embodiment. The substrate holding device 70 produces the same operation and effect as the substrate holding device 10 of the first embodiment. In other words, the main control section 12 appropriately determines the adsorption anomaly of the wafer W on the basis of the magnetic force information, which is the comparison between the magnetic force value at the first adsorption section 72 for performing the adsorption of the central portion of the wafer W and the magnetic force value at the second adsorption section 73 for performing the adsorption of the outer peripheral portion of the wafer W, provided from the magnetic information control section 78. While in the present embodiment, the installation number of the magnetometers corresponding to the first adsorption section 72 and the second adsorption section 73 is two, the present invention is not limited thereto. More accurate results can be obtained with increasing the installation number of the magnetometers.

Fourth Embodiment

Figure 11:
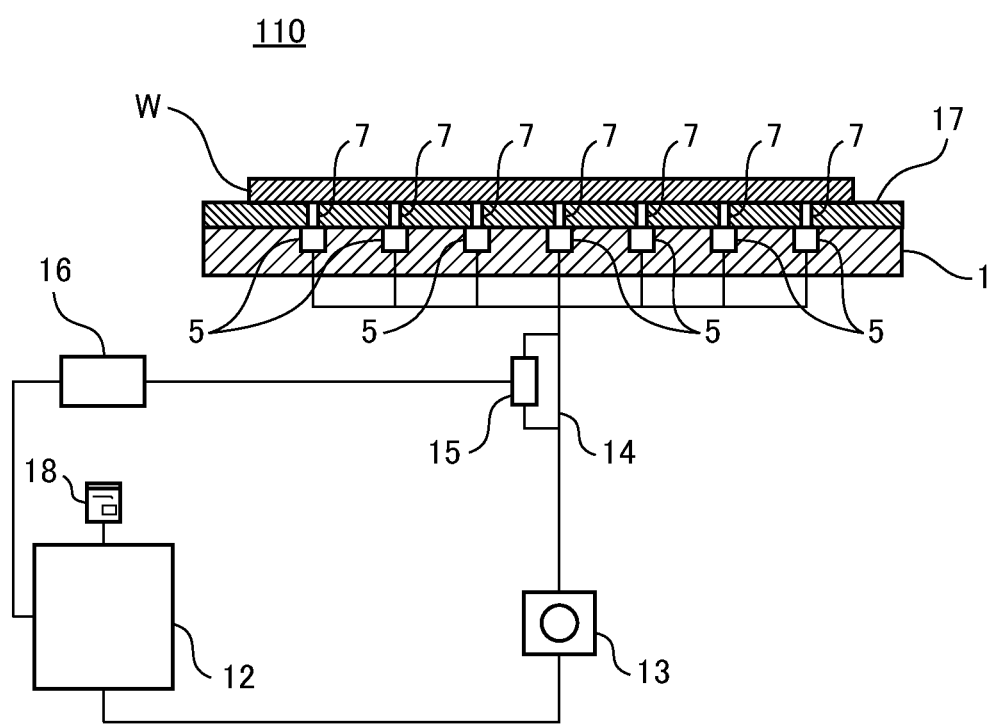
FIG. 11 is a schematic diagram illustrating a configuration of a substrate holding device according to a fourth embodiment of the present invention.

Next, a substrate holding device according to a fourth embodiment will now be described. FIG. 11 is a schematic diagram illustrating a configuration of a substrate holding device according to a fourth embodiment. In FIG. 11, the same elements as those shown in FIG. 1 are designated by the same reference numerals and explanation thereof will be omitted. While a plurality of pressure sensors is provided in the first embodiment, a substrate holding device 110 of the present embodiment differs in that a single pressure sensor 15 is provided therewith.

Figure 12:
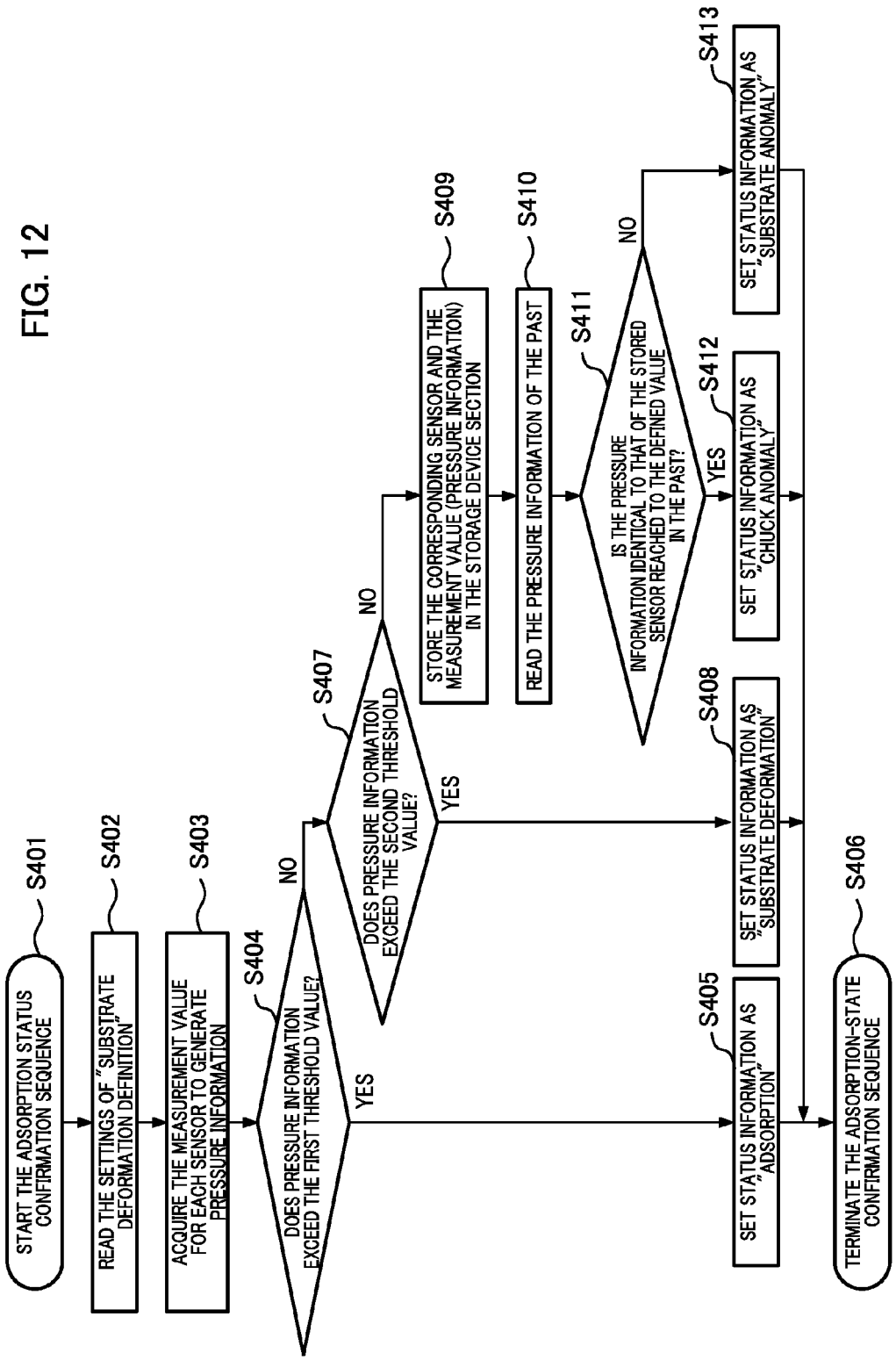
FIG. 12 is a flowchart showing the flow of the adsorption confirmation sequence according to a fourth embodiment of the present invention.

FIG. 12 is a flowchart showing the flow of the adsorption confirmation sequence, which corresponds to processing shown in the flowchart of the adsorption confirmation sequence shown in FIG. 4. In the adsorption confirmation sequence of the present embodiment, the main control section 12 sets two threshold values, i.e., a first threshold value and a second threshold value, so as to determine the presence or absence of adsorption anomaly and the presence or absence of substrate deformation by using the threshold values. When substrate deformation as shown in FIGS. 5A, 5B, 6A, and 6B occurs for the wafer W mounted on the chuck body 1, the entire wafer W surface is not in contact with the holding surface of the chuck body 1, and thereby adsorption pressure may not increase. Accordingly, the main control section 12 determines the presence or absence of substrate deformation by utilizing this phenomenon.

Figure 13A:
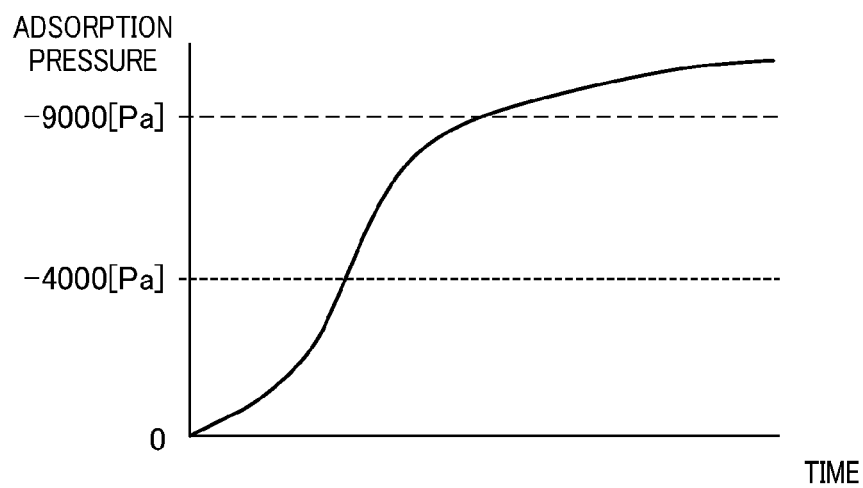
FIG. 13A is a diagram illustrating a pressure wave in the case where a substrate is properly adsorbed according to the fourth embodiment of the present invention.
Figure 13B:
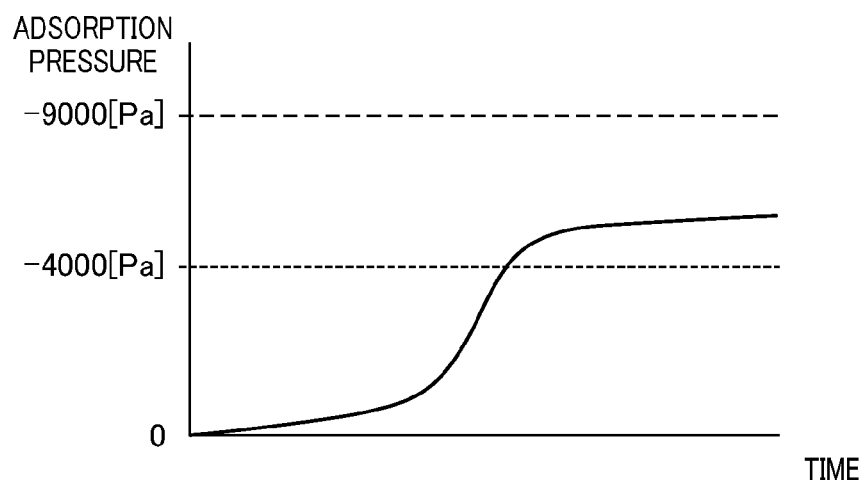
FIG. 13B is a diagram illustrating a pressure wave in the case where a substrate is deformed according to the fourth embodiment of the present invention substrate.
Figure 13C:
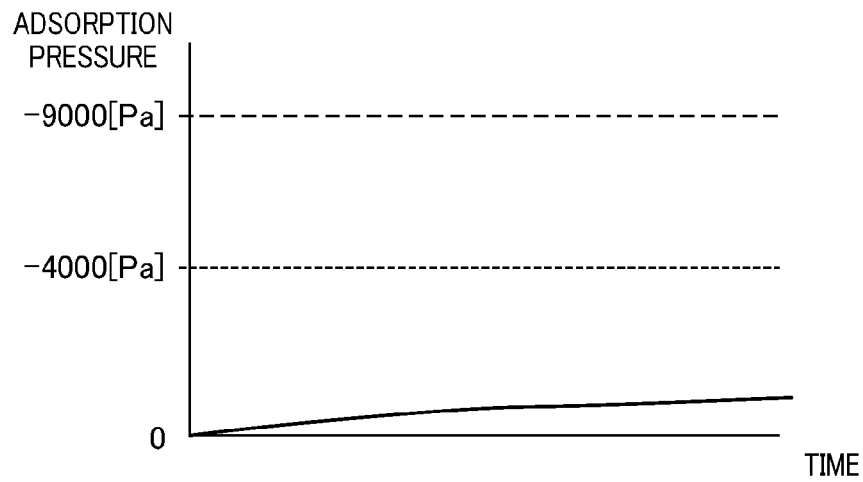
FIG. 13C is a diagram illustrating a pressure wave in the case where there is an anomaly on the substrate or the chuck body according to the fourth embodiment of the present invention.

Each of FIGS. 13A to 13C is a graph illustrating a pressure wave of pressure information shown by the pressure sensors 15 of the present embodiment. In particular, FIG. 13A shows a wave form in the case where no substrate deformation occurs and the wafer W is properly adsorbed. FIG. 13B shows a wave form in the case where the wafer W subjected to substrate deformation is adsorbed. FIG. 13C shows a wave form in the case where there is an anomaly on the substrate or the chuck. It should be noted that FIGS. 13A to 13C show how pressure information decreases from atmospheric pressure 0 (pa) while the adsorption pressure (gauge pressure) is plotted on the vertical axis and the exhaust time is plotted on the horizontal axis.

Hereinbelow, the adsorption confirmation sequence of the present embodiment will now be described with reference to FIGS. 12, and 13A to 13C. First, in the flowchart shown in FIG. 12 as in the flowchart shown in FIG. 4, the main control section 12 starts the adsorption confirmation sequence (step S401), and reads out the settings of "substrate deformation definition" from the internal storage device (step S402). At this time, the values read from the storage device are the first threshold value of −9000 (Pa(G)) and the second threshold value of −4000 (Pa(G)), both of which are preset.

Next, the main control section 12 causes the pressure information control section 16 to acquire the measurement value of the pressure sensor 15 in an arbitrary time interval, and further generate pressure information, and thereby the main control section 12 receives pressure information from the pressure information control section 16 (step S403).

Next, based on the pressure information obtained in step S403, the main control section 12 determines whether or not the pressure information is reached to an adsorption defined value (whether or not the first condition is satisfied) (step S404). Here, the implicit assumption is that if the measurement value (pressure information) of the pressure sensor 15 indicates a value less than or equal to the first threshold value, the wafer W is properly adsorbed on the chuck body 1.

Next, as a first pattern, assume the case that it is determined that the wafer W is properly adsorbed since the adsorption information of the transferred wafer W indicates a value less than or equal to the first threshold value as shown in FIG. 13A (Yes in step S404). In this case, the main control section 12 defines status information as "adsorption" (step S405). Then, the main control section 12 terminates the adsorption confirmation sequence (step S406). Note that the defined value for defining adsorption may be other value than the aforementioned one, and the present invention is not particularly limited thereto.

On the other hand, if the pressure information has not been reached to the first threshold value in step S404 (No in step S404), the main control section 12 determines whether or not the pressure information indicates a value less than or equal to the second threshold value defined as the substrate deformation definition that has been read in step S402 (whether or not the second condition is satisfied) (step S407).

Next, as a second pattern, assume the case that the pressure information reaches to the second threshold value, which is a value to be determined as substrate deformation, in step S407, as shown in FIG. 13B (Yes in step S407). In this case, in the second pattern, the main control section 12 status information as "substrate deformation" (step S408). Then, the main control section 12 terminates the adsorption confirmation sequence (step S406).

On the other hand, assume the case that the pressure information does not exceed the second threshold value in step S407, as shown in FIG. 13C (No in step S407). In this case, the same processing steps after step S209 in the flowchart shown in FIG. 4 is carried out after step S409 shown in FIG. 12 to thereby define status information as "chuck anomaly" or "substrate anomaly". The explanation of steps S409 to S413 is the same as those of steps S209 to S213 shown in FIG. 4, and thus an explanation thereof will be omitted here.

In the present embodiment, the main control section 12 carries out a first determination based on a first condition and a measurement result obtained by a pressure sensor, and a second determination based on a second condition that is different from the first condition and a measurement result obtained by the pressure sensor. Here, the first condition is whether or not the measured pressure (negative pressure) exceeds a predetermined value, and the second condition is whether or not the measured pressure (negative pressure) exceeds a second predetermined value that is different from the first condition. With this arrangement, although the substrate holding device 110 includes only one pressure sensor, the substrate holding device 110 provides the same effects as those of the substrate holding device 10 of the first embodiment. While in the present embodiment the main control section 12 carries out determination based on the second condition if the first condition is not satisfied in the first determination, the main control section 12 may simultaneously carry out the first determination and the second determination to execute processing depending on the combinations of these results. Furthermore, the flowchart of the present embodiment shown in FIG. 12 can also be applied not only to the configuration of the first embodiment but also to the configurations of the second and third embodiments, whereby adsorption anomaly can be specified.

Fifth Embodiment

Next, the substrate holding device according to the fifth embodiment will now be described. The configuration of the substrate holding device of the present embodiment is the same as that of the fourth embodiment, and thus an explanation thereof will be omitted here. In the fourth embodiment, adsorption anomaly is determined depending on whether or not the pressure information exceeds any threshold value, whereas the substrate holding device of the present embodiment is characterized in that adsorption anomaly is determined depending on the time until an arbitrary threshold value (pressure value) is reached.

Figure 14:
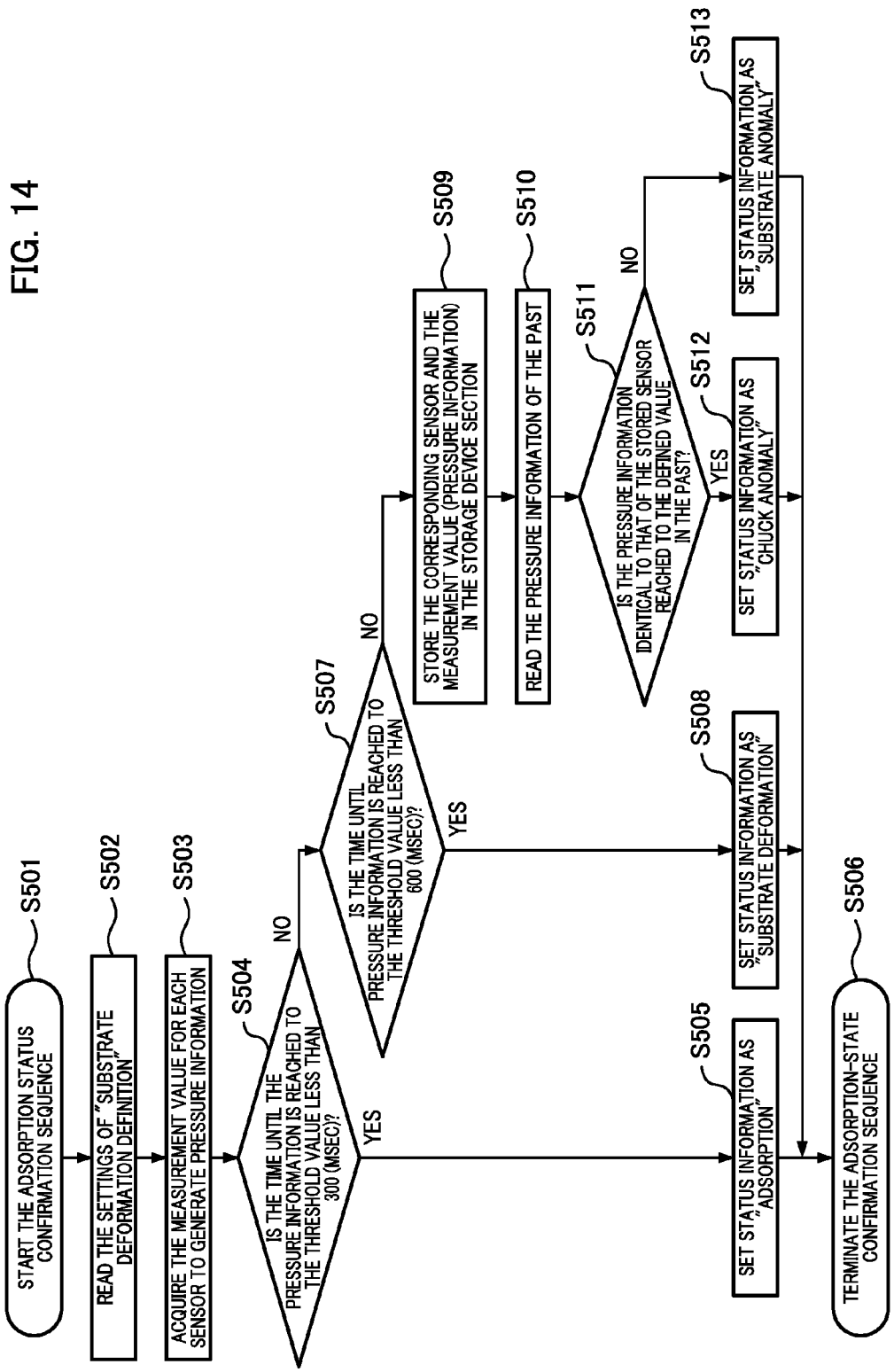
FIG. 14 is a flowchart showing the flow of the adsorption confirmation sequence according to a fifth embodiment of the present invention.

FIG. 14 is a flowchart showing the flow of the adsorption confirmation sequence, which corresponds to processing shown in the flowchart of the adsorption confirmation sequence shown in FIG. 4. In the adsorption confirmation sequence of the present embodiment, the main control section 12 sets a threshold value (hereinafter referred to as "third threshold value" for distinguishing it from the fourth embodiment) so as to determine the presence or absence of adsorption anomaly and the presence or absence of substrate deformation by using the threshold value. When substrate deformation as shown in FIGS. 5A, 5B, 6A, and 6B occurs for the wafer W mounted on the chuck body 1, the entire wafer W surface is not in contact with the holding surface of the chuck body 1, and thereby an decrease in adsorption pressure is time consuming. Accordingly, the main control section 12 determines the presence or absence of substrate deformation by utilizing this phenomenon.

Figure 15A:
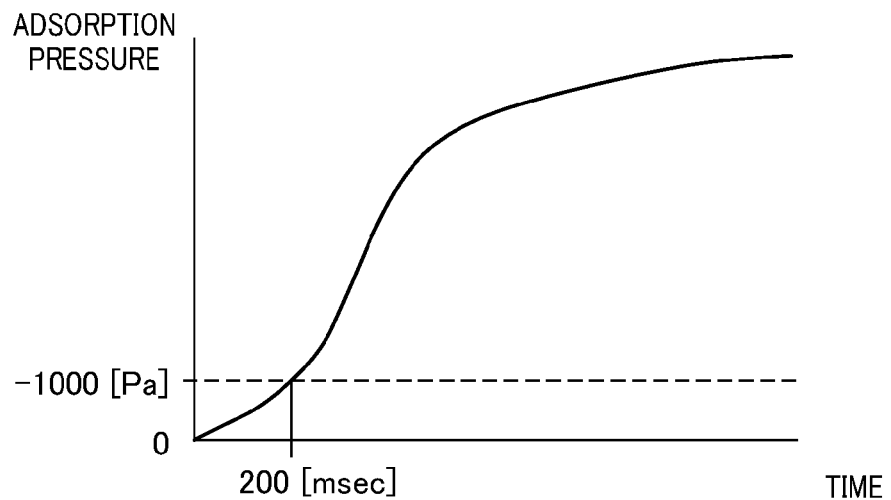
FIG. 15A is a diagram illustrating a pressure wave in the case where a substrate is properly adsorbed according to the fifth embodiment of the present invention.
Figure 15B:
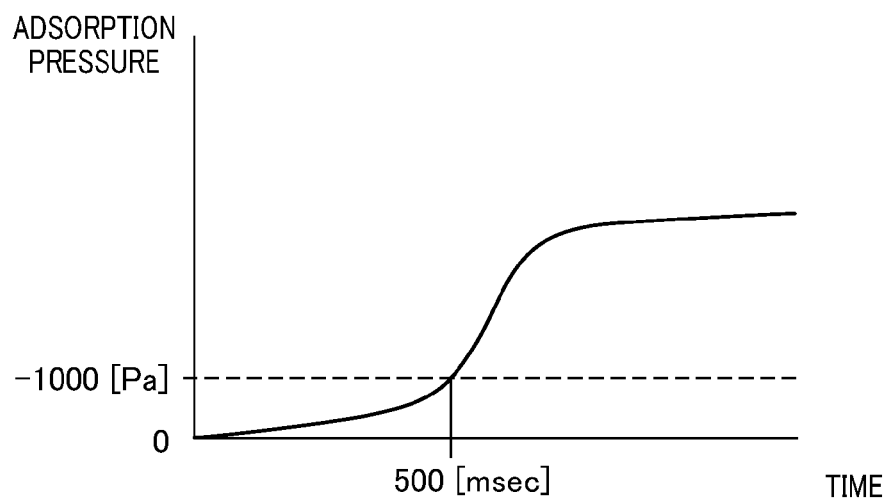
FIG. 15B is a diagram illustrating a pressure wave in the case where a substrate is deformed according to the fifth embodiment of the present invention.
Figure 15C:
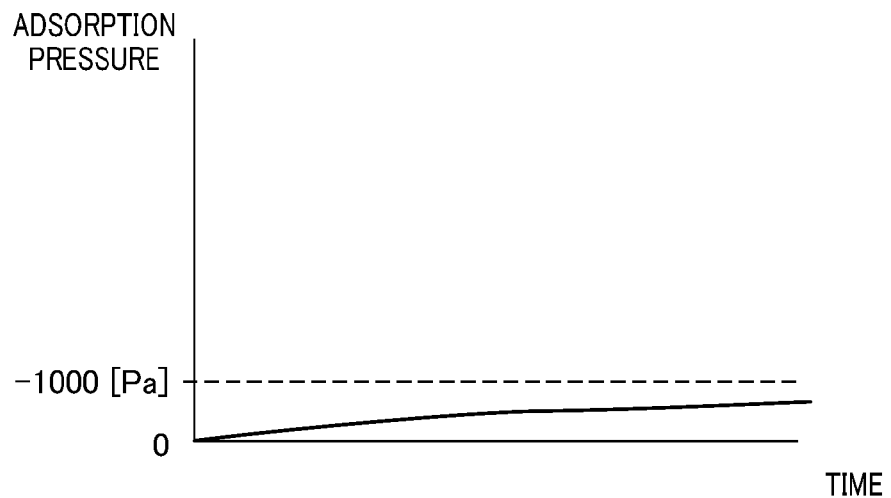
FIG. 15C is a diagram illustrating a pressure wave in the case where there is an anomaly on the substrate or the chuck body according to the fifth embodiment of the present invention.

Each of FIGS. 15A to 15C is a graph illustrating a pressure wave of pressure information shown by the pressure sensors 15 of the present embodiment. In particular, FIG. 15A shows a wave form in the case where the wafer W is properly adsorbed. FIG. 15B shows a wave form in the case where the wafer W subjected to substrate deformation is adsorbed. FIG. 15C shows a wave form in the case where there is an anomaly on the substrate or the chuck. It should be noted that FIGS. 15A to 15C show how pressure information decreases from atmospheric pressure 0 (pa) while the adsorption pressure (gauge pressure) is plotted on the vertical axis and the exhaust time is plotted on the horizontal axis.

Hereinbelow, the adsorption confirmation sequence of the present embodiment will now be described with reference to FIGS. 14, and 15A to 15C. First, in the flowchart shown in FIG. 14 as in the flowchart shown in FIG. 4, the main control section 12 starts the adsorption confirmation sequence (step S501), and reads out the settings of "substrate deformation definition" from the internal storage device (step S502). At this time, the values read from the storage device are the preset third threshold value of −1000 (Pa(G)), the time settings of 300 (msec) for the determination of normal adsorption, and the time settings of 600 (msec) for the determination of occurrence of substrate deformation.

Next, the main control section 12 causes the pressure information control section 16 to acquire the measurement value of the pressure sensor 15 in an arbitrary time interval, and further generate pressure information, and thereby the main control section 12 receives pressure information from the pressure information control section 16 (step S503).

Next, based on the pressure information obtained in step S503, the main control section 12 determines whether or not the time until the pressure information is reached to the defined value of adsorption is below the defined time (whether or not the first condition is satisfied) (step S504). Here, the implicit assumption is that if the time until the measurement value (pressure information) of the pressure sensor 15 indicates a pressure less than or equal to the third threshold value of −1000 (Pa(G)) is below 300 (msec) as described above, the wafer W is properly adsorbed on the chuck body 1.

Next, as a first pattern, assume the case that it is determined that the wafer W is properly adsorbed since the time until the adsorption information of the transferred wafer W is reached to the third threshold value of −1000 (Pa(G)) indicates 200 (msec) as shown in FIG. 15A (Yes in step S504). In this case, the main control section 12 defines the status information as "adsorption" (step S505). Then, the main control section 12 terminates the adsorption confirmation sequence (step S506). Note that the defined time for defining adsorption may be other value than the aforementioned one, and the present invention is not particularly limited thereto.

On the other hand, if the time until pressure information is reached to the third threshold value is 300 (msec) or more in step S504 (No in step S504), the main control section 12 determines whether or not the time until pressure information is reached to the third threshold value, which has been read in step S502, is less than 600 (msec) (whether or not the second condition is satisfied) (step S507).

Next, as a second pattern, assume the case that the time until pressure information is reached to −1000 (Pa(G)) is 500 (msec) in step S507, as shown in FIG. 15B (Yes in step S507). In this case, in the second pattern, the main control section 12 determines the status information as "substrate deformation" (step S508). Then, the main control section 12 terminates the adsorption confirmation sequence (step S506).

On the other hand, assume the case that the time until pressure information is reached to −1000 (Pa(G)) exceeds 600 (msec) in step S507, as shown in FIG. 15C (No is step S507). In this case, the same processing steps after step S209 in the flowchart shown in FIG. 4 are carried out after step S509 shown in FIG. 12 to thereby define the status information as "chuck anomaly" or "substrate anomaly". The explanation of steps S509 to S513 is the same as those of steps S209 to S213 shown in FIG. 4, and thus an explanation thereof will be omitted here.

Thus, in the present embodiment, the main control section 12 carries out a first determination based on a first condition and a measurement result obtained by a pressure sensor, and a second determination based on a second condition that is different from the first condition and a measurement result obtained by the pressure sensor. Here, the first condition is whether or not a time required for the measured pressure (negative pressure) to exceed a predetermined value exceeds a predetermined time, and the second condition is whether or not a time required for the measured pressure (negative pressure) to exceed a second predetermined value different from the first condition exceeds a predetermined time that is different from the first condition. With this arrangement, the substrate holding device of the present embodiment provides the same effects as those of the substrate holding device of the fourth embodiment. While in the present embodiment the main control section 12 carries out determination based on the second condition if the first condition is not satisfied in the first determination, the main control section 12 may simultaneously carry out the first determination and the second determination to execute processing depending on the combinations of these results. It should be noted that the first condition may be whether or not the measured pressure exceeds a predetermined value.

(Substrate Transport Apparatus)

Next, an embodiment of a substrate transport apparatus will now be described. FIG. 16A is a schematic diagram illustrating a configuration of a substrate transport apparatus applied to an exposure apparatus, i.e., a lithography apparatus. In this case, an exposure apparatus 80 includes a substrate stage 81, the substrate transport device 82, a substrate stocker 83, and the main control section 12.

The substrate stage 81 includes the substrate holding device 10, and is a stage apparatus that is movable in the X and Y directions while placing and holding the wafer W thereon. The substrate stage 81 is employed in the exposure processing section of the exposure apparatus to be exemplified below.

The substrate transport device 82 is a transfer means that carries in and out of the wafer W, i.e., the substrate to be treated on the substrate stage 81. The substrate transport device 82 includes a substrate holding device, and the substrate holding device includes a transporting section 84 for holding and transporting the wafer W, a vacuum pump 85, and a vacuum exhaust line 87 that connects the vacuum pump 85 with three exhaust ducts 86 formed in the transporting section 84. Furthermore, the substrate transport device 82 includes a pressure sensor 88 mounted on the vacuum exhaust line 87. While in the present embodiment, the substrate transport device 82 is arranged to hold the wafer W by vacuum adsorption for purposes of explanation, the electrostatic adsorption method or the magnetic adsorption method as described above may also be employed. Furthermore, the installation number of the substrate transport device 82 is one for convenience, but a plurality of the substrate transport devices 82 may also be provided. It should be noted that the substrate holding device provided by the substrate transport device 82 can have the same function as that of the substrate holding device described in the first to fifth embodiments. However, in the present embodiment, for simplifying the constitution, an example in which only the substrate stage has the same function as that of the substrate holding device described in the first to fifth embodiments and the substrate holding device only capable of determining the presence or absence of adsorption is provided with the substrate transport devices 82 will be described.

Figure 16B:
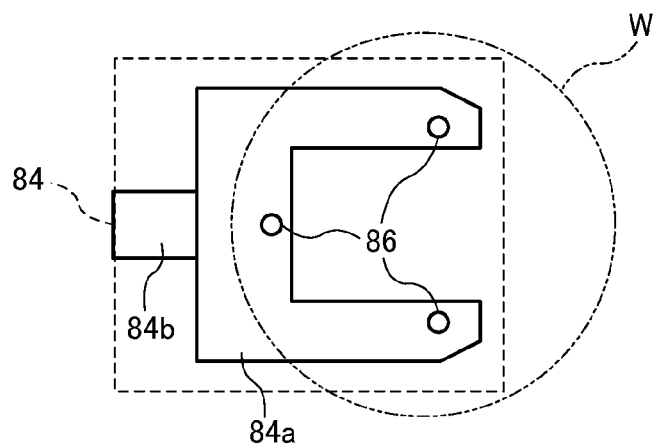
FIG. 16B is a schematic plan view illustrating a configuration of a transporting section.

FIG. 16B is a schematic plan diagram illustrating a configuration of the transporting section 84. The transporting section 84 includes a U-shaped holding section 84a and a substrate transporting arm 84b. The holding section 84a is a section that places the wafer W and holds it by vacuum adsorption. A holding unit is constituted by the holding section 84a and a vacuum waste system. The shape of the holding section 84a is not limited to U-shaped and may be any shape as long as the holding section 84a can transport the wafer W. The configuration thereof is also not particularly limited. In addition, the substrate transporting arm 84b is appropriately movable to a desired position by a transporting robot (not shown).

The vacuum pump 85 is an exhaust unit that performs vacuum exhaust to hold the wafer, which is placed on the holding section 84a, by vacuum adsorption. Here, the vacuum exhaust line 87 is connected to the holding section 84a for convenience, but may be connected to another vacuum exhaust line. The pressure sensor 88 is a pressure sensor that measures the pressure value of the vacuum exhaust line 87. The pressure sensor 88 successively monitors pressure information, as well as transmits the pressure information to the main control section 12. Here, the term "pressure information" is the same as described in the first embodiment.

The substrate stocker 83 is a storage that temporarily stores a plurality of wafer W. The substrate transport device 82 acquires the wafer W from the substrate stocker 83 so as to transport the wafer W to the substrate stage 81. Likewise, the substrate transport device 82 acquires the wafer W from the substrate stage 81 so as to transport the wafer W to the substrate stocker 83. While the substrate stocker 83 can store the wafer W positioned within the substrate transport apparatus 80, for example, the substrate stocker 83 may also be a mechanism that temporarily holds the wafer W in order to carry out the transfer of the wafer W.

Furthermore, as in the configuration of the substrate holding device 10, the main control section 12 is connected to the substrate stage 81, the substrate transport device 82, the substrate stocker 83, the vacuum pump 85, and the pressure sensor 88 via a LAN cable or the like so as to transmit various operation commands.

Next, the substrate stage 81 and the substrate transport device 82 according to an embodiment of the present invention will now be described. For example, a description will be given in the case where the substrate transport device 82 receives the wafer W from the substrate stage 81 to transport it to the substrate stocker 83. First, assume that when the substrate transport device 82 transfers the wafer W, the wafer W is placed on the holding section 84a to start the vacuum adsorption of the wafer W by the transporting section 84. Here, in the case of "substrate deformation" representing the state that the wafer W is deformed, "substrate anomaly" representing the state that dust is attached on the back side of the wafer W, or "adsorption member anomaly" representing the state that an anomaly occurs on the substrate transporting exhaust duct 86, a phenomenon in which pressure does not increase occurs as in the substrate holding device 10. When such phenomenon occurs, for example, the transportation of the wafer W can be stopped immediately due to an error occurrence. However, preventing an increase in the down time of the transportation of the wafer W is also crucial. In such a case, in the present embodiment, the main control section 12 instructs the substrate transport device 82 to change the speed and acceleration such that the wafer W does not fall down to thereby continue the transportation of the wafer W.

First, in the present embodiment, since the substrate stage 81 employs the substrate holding device 10, the status information of the wafer W upon the placement of the wafer W can be classified (determined) into any one of "adsorption", "substrate deformation", "chuck anomaly", or "substrate anomaly". In particular, when the wafer W is in the state of "substrate deformation" or "substrate anomaly", the adsorption pressure (holding force) for the wafer W does not increase in the substrate transport device 82 that performs continuous acquisition and transportation of the wafer W, resulting in increased risk for falling of the wafer W. Thus, when the status information of the wafer W is "substrate deformation" or "substrate anomaly", the main control section 12 sets the value of the speed/acceleration for the substrate transport device 82 shown in FIG. 8B, which has been set by the setting display section 51, to the substrate transport device 82 in advance so as to prevent the wafer W from falling down.

On the other hand, when adsorption pressure has not increased after the substrate transport device 82 starts the vacuum adsorption of the wafer W, the anomaly for preventing adsorption of the wafer W is difficult to be specified. Consequently, the adsorption pressure of the wafer W is also not increased in the substrate stage 81 to which the wafer W is continuously transported, resulting in increased risk for falling of the wafer W. Hence, when the adsorption pressure of the substrate transport device 82 does not reach to the threshold value, the main control section 12 sets the driving speed/acceleration of the substrate stage 21 to a value which does not result in falling of the wafer W so as to prevent the wafer W from falling down. Here, the term "a value which does not result in falling of the wafer W" as used herein may refer to a setting value of the speed/acceleration for the substrate holding device shown in FIG. 8B in the setting display section 50 or an extremely slow speed/acceleration value, which does not result in falling of the wafer W, set in the main control section 12.

Furthermore, when the substrate stocker 83 has a mechanism for holding (adsorbing) the wafer W, assume that adsorption pressure is not increased due to some causes as described above. Also in this case, according to the present embodiment, the main control section 12 prevents falling of the wafer W from the substrate transport device 82 or the substrate stage 81 to which the wafer W is continuously transported, whereby speed/acceleration for a device, which is involved for the transportation of the wafer W, may also be changed. According to the present embodiment, the main control section 12 detects a adsorption anomaly of the substrate transport apparatus so as to prevent the wafer W from falling down, speed/acceleration for a device, which is involved for the transportation of the wafer W, may also be changed.

Figures 17, 18:
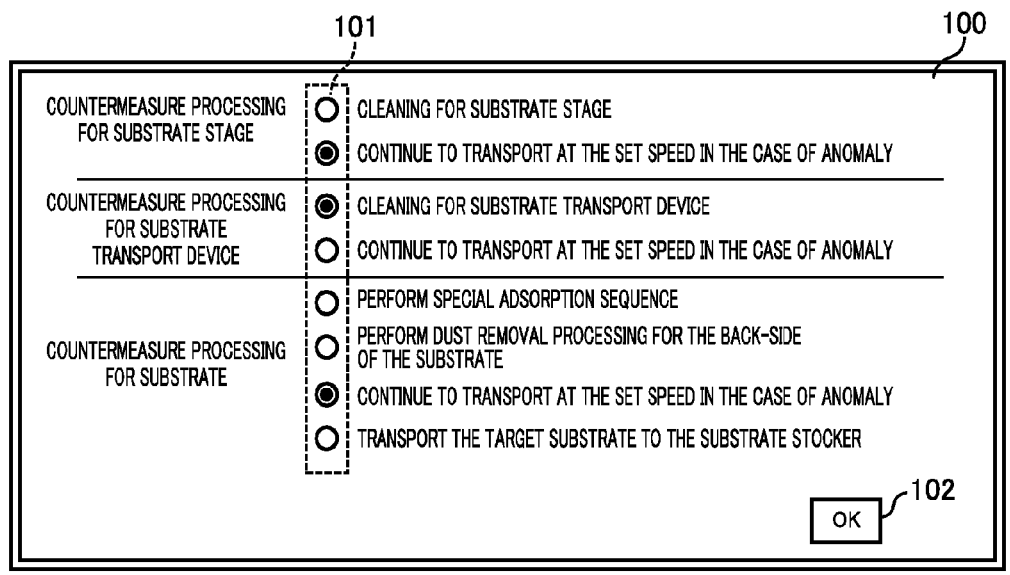
FIG. 17 is a table illustrating determination results obtained from the information relating to a substrate holding in the substrate transport apparatus.
FIG. 18 is a schematic diagram illustrating an exemplary setting screen to be displayed on a console section.

FIG. 17 is a comparison diagram illustrating whether or not the substrate stage 81 and the substrate transport device 82 adsorb the wafer W in a normal way. First, a first case (case 1) is given when the adsorption operation is completed with success by both of the substrate stage 81 and the substrate transport device 82. In this case, the main control section 12 determines that there is no anomaly occurring at all of the wafer W, the substrate stage 81, and the substrate transport device 82. Next, a second case (case 2) is given when the adsorption operation is completed with success by the substrate stage 81, whereas the adsorption operation is completed with failure by the substrate transport device 82. In this case, the main control section 12 determines that the cause of the adsorption anomaly is present within the configuration of the substrate transport device 82 based on the adsorption operation successfully performed by the substrate stage 81. Next, a third case (case 3) is given when the adsorption operation is completed with failure by the substrate stage 81, whereas the adsorption operation is completed with success by the substrate transport device 82. In this case, the main control section 12 determines that the cause of the adsorption anomaly is present within the configuration of the substrate stage 81 based on the adsorption operation successfully performed by the substrate transport device 82. Furthermore, a fourth case (case 4) is given when the adsorption operation is completed with failure by both of the substrate stage 81 and the substrate transport device 82. In this case, the main control section 12 determines that a cause for defective adsorption such as "substrate deformation" or "substrate's back side anomaly" is present on the wafer W because the probability of occurrence of an anomaly for both device configurations is low.

While in the present embodiment, the determination for two configurations, the substrate stage 81 and the substrate transport device 82 is made by limiting on four cases, a different determination may be made depending on the contents of the aforementioned configuration and a method for producing another determination (algorithm). When a plurality of wafers W is transported, operation information involved in the adsorption operation in the substrate transport apparatus 80 increases. Hence, settings for a more detailed determination may be made. In other words, while the determination is changed depending on the number of information to be handled and a method for guiding a determination (algorithm), the cause of the adsorption anomaly can be determined if the information whether or not the adsorption (holding) of the wafer W is successfully completed by each of the constituent devices is integrated.

Furthermore, based on the information determined from the four cases, the main control section 12 may also perform the corresponding processing for the cause of such an anomaly or provide an error notification to the console section 18. In this case, the corresponding processing for the cause of such an anomaly is set at the following setting screen to be displayed on the console section 18. FIG. 18 is an example of a setting screen to be displayed on the console section 18. An operation setting display section 100 shown in FIG. 18 is a setting screen that sets the operation contents to be performed by the substrate stage 81 or the substrate transport apparatus 82. In the operation setting display section 100, "corresponding processing for substrate stage" is a display field that sets (selects) a countermeasure method if it is determined that the cause of an anomaly lies in the substrate stage 81 based on determination in preceding four cases. Also, "corresponding processing for substrate transport device" is a display field that sets a countermeasure method if it is determined that the cause of an anomaly lies in the substrate transport device 82 based on determination in preceding four cases. Furthermore, "corresponding processing for substrate" is a display field that sets a countermeasure method if it is determined that the cause of an anomaly lies in the substrate (wafer W) based on determination in preceding four cases. In addition, a toggle button 101 is a button that selects the respective settings. A determination button 102 is a button that determines the settings selected by the toggle button 101 so as to bring them to the main control section 12.

As can be understood from the description above, in accordance with the present invention, when the adsorption anomaly of the wafer W occurs, the speed/acceleration of the substrate stage 81 or the substrate transport device 82 is changed in advance for the continuous transportation of the wafer W, whereby falling or shifting of the wafer W can be prevented. At this time, the information regarding the adsorption of the wafer W performed by the constituent devices is integrated, and thereby the point of occurrence of the adsorption anomaly can be appropriately determined. Also, by previously setting the restoration processing method corresponding to the respective adsorption anomalies, appropriate corresponding processing can be performed after the adsorption anomaly occurs, resulting in the reduction of down time for the semiconductor manufacturing apparatus (e.g., exposure apparatus). Furthermore, the aforementioned effects are realized by employing the substrate holding device 10 described above, whereby a large-scaled anomaly detection apparatus is not required, and thereby it is advantageous in terms of costs and space.

(Exposure Apparatus)

Figure 19:
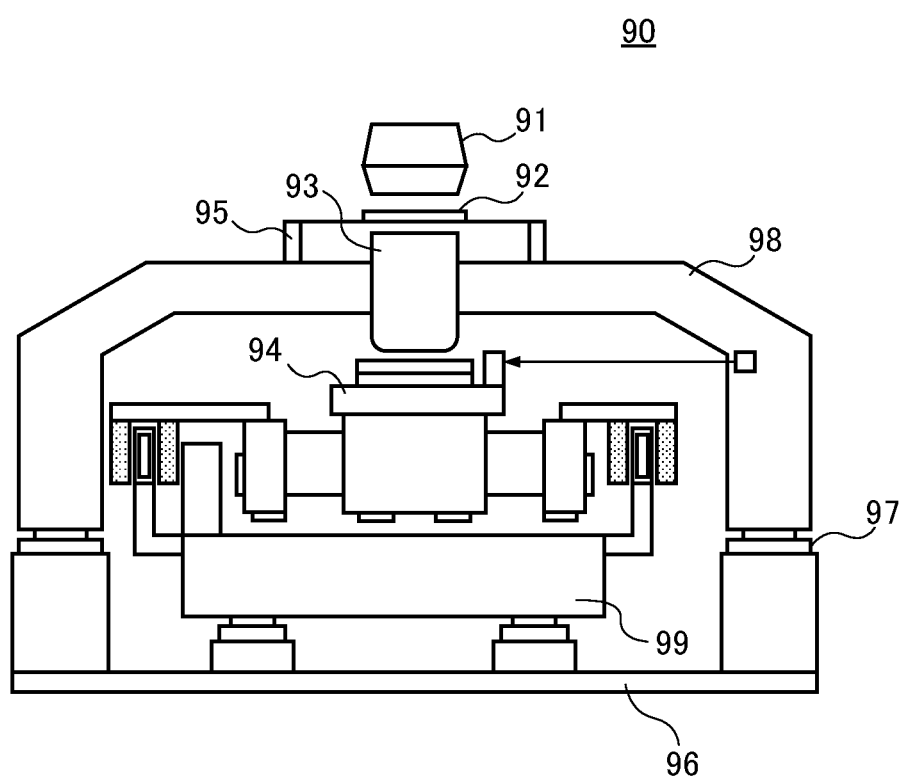
FIG. 19 is a schematic diagram illustrating a configuration of an exposure apparatus to which the substrate holding device of the present invention is applied.

Next, an embodiment of the exposure apparatus, as an example of a lithography apparatus, to which the substrate holding device of the present invention is applied will now be described. FIG. 19 is a schematic diagram illustrating a configuration of an exposure apparatus. An exposure apparatus 90 includes an illumination optical system 91, a reticle stage 92 that holds a reticle (original), a projection optical system 93, and a substrate stage 94 that holds a substrate. It should be noted that the exposure device 90 according to the present embodiment is a scanning projection exposure device that exposes a circuit pattern formed on the reticle onto the wafer employing a step-and-repeat system or a step-and-scan system.

The illumination optical system 91 includes a light source portion (not shown), and is a device that illuminates the reticle on which a transfer circuit pattern is formed. At the light source portion, the light source uses a laser, for example. The available laser includes an ArF excimer laser with a wavelength of about 193 nm, a KrF excimer laser with a wavelength of about 248 nm, a F2 excimer laser with a wavelength of about 157 nm, and the like. The type of laser is not limited to an excimer laser, and for example, a YAG laser may also be used. The number of lasers is also not limited. In addition, when the light source portion utilizes a laser, a light beam shaping optical system that shapes a parallel pencil from the laser light source into a desired beam shape or an incoherent optical system that makes a coherent laser incoherent is preferable. Furthermore, a light source available for the light source portion is not limited to a laser, but a single or a plurality of lamps such as mercury lamp or xenon lamp may also be used.

The illumination optical system 91 includes a lens, a mirror, a light integrator, a diaphragm, and the like. In general, the optical system is aligned in the order of a condenser lens, a fly-eye lens, an aperture diaphragm, a condenser lens, a slit, and an imaging optical system. The illumination optical system 91 can be used for both on-axis light or off-axis light. The light integrator includes an integrator constructed by overlaying a fly-eye lens or two pairs of cylindrical lens array sheets. It should be noted that the light integrator may be replaced with an optical rod or a diffractive element. Also, an aperture diaphragm is arranged as a circular diaphragm, an annular illumination diaphragm for deformed illumination, a quadruple illumination diaphragm, and the like.

The reticle is made of quartz glass, for example. A circuit pattern to be transferred is formed on the reticle. Also, the reticle stage 92 is a stage that is movable in the X and Y directions, and is a device for holding a reticle. Note that the reticle stage 92 is held on a reticle stage plate 95.

The projection optical system 93 projects and exposes a pattern in the reticle, which is illuminated with exposure light from the illumination optical system 91, onto the substrate with a predetermined magnification (e.g., ¼ or ⅕). As the projection optical system 93, an optical system consisting only of a plurality of optical elements or an optical system (catadioptric optical system) consisting of a plurality of optical elements and at least one concave mirror can be employed. Alternatively, as the projection optical system 93, an optical system consisting of a plurality of optical elements and at least one diffractive optical element such as a kinoform, an entire mirror type optical system, or the like can also be employed. It should be noted that the reticle stage plate 95 and the projection optical system 93 are supported to a lens barrel plate 98 via a dumper 97 on a floor (basis surface) 96.

The substrate is a target to be processed such as a silicon wafer or the like. A resist (photosensitizing agent) is applied on the surface thereof. Also, the substrate stage 94 is a stage that is movable in the X and Y directions including the substrate holding device of the present invention, and is a device for holding a substrate. The substrate stage 94 is provided on a stage plate 99 which is mounted on the floor (basis surface) 96.

In the exposure device 90 according to the present embodiment, the diffracted light generated from the reticle passes through the projection optical system 93 and is projected on the substrate. The substrate is in a conjugated relationship with the reticle. In the case of a scanning type projection exposure device, the pattern of the reticle is transferred onto the substrate by scanning the reticle and the substrate. In the case of a stepper (step-and-repeat type exposure device), exposure is performed while the reticle and the substrate are held stationary. Note that the substrate holding device of the present invention is not limited to the exemplified exposure apparatus, but may also be applied to a lithography apparatus for transferring a pattern onto a substrate.

(Device Manufacturing Method)

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which a transparent electrode is formed. The process of forming a plurality of transparent electrodes includes a step of coating a glass substrate with a transparent conductive film deposited thereon with a photoresist, a step of exposing the glass substrate coated with the photoresist thereon to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

Other Embodiments

Although the foregoing embodiment has been described for the case in which the status information of the adsorption anomaly is classified into three types: "substrate deformation", "chuck anomaly", and "substrate anomaly", the present invention is not particularly limited thereto. For example, in order to specify a adsorption anomaly more accurately, the status information can be set so as to specify three or more types or two types of classification.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-092458 filed Apr. 6, 2009, No. 2009-284545 filed Dec. 15, 2009 and No. 2010-063566 filed Mar. 19, 2010 which are hereby incorporated by reference herein in their entirety.

What is claimed is:

1. A substrate holding device for holding a substrate, comprising:
    a holding unit that adsorbs and holds the substrate;
    a measuring section that measures a physical quantity relating to an adsorption force of the holding unit with the substrate mounted on the holding unit; and
    a control section that carries out a first determination that determines whether or not the measured physical quantity exceeds a first threshold value and a second determination that determines whether or not the measured physical quantity exceeds a second threshold value different from the first threshold value to determine the presence or absence of an adsorption anomaly of the substrate and to specify a cause of the adsorption anomaly based on the result of first and second determinations, if the control section determines that the adsorption anomaly is present, so as to execute processing depending on the specified cause of the adsorption anomaly.

2. The substrate holding device according to claim 1, wherein the holding unit adsorbs the substrate by reducing the pressure in a space formed between the substrate and the holding unit, and the measuring section measures the pressure in the space or a space that communicates with the space.

3. A substrate holding device for holding a substrate, comprising:
    a holding unit that adsorbs and holds the substrate;
    a plurality of measuring sections that measure a physical quantity relating to an adsorption force of the holding unit with the substrate mounted on the holding unit; and
    a control section that carries out a first determination that determines whether or not all physical quantities measured by the plurality of measuring sections exceeds a predetermined value and a second determination that determines whether or not a distribution of the physical quantities measured by the plurality of measuring sections exceeds a predetermined range to determine the presence or absence of an adsorption anomaly of the substrate and to specify a cause of the adsorption anomaly based on the result of first and second determinations, if the control section determines that the adsorption anomaly is present, so as to execute processing depending on the specified cause of the adsorption anomaly.

4. A substrate holding device for holding a substrate, comprising:
    a holding unit that adsorbs and holds the substrate;
    a measuring section that measure a physical quantity relating to an adsorption force of the holding unit in response to elapsed time with the substrate mounted on the holding unit; and
    a control section that carries out a first determination that determines whether or not the time required for the physical quantity measured by the measuring section to reach a threshold value exceeds a first time and a second determination that determines whether or not the time required for the physical quantity measured by the measuring section to reach a threshold value exceeds a second time different from the first time to determine the presence or absence of an adsorption anomaly of the substrate and to specify a cause of the adsorption anomaly based on the result of first and second determinations, if the control section determines that the adsorption anomaly is present, so as to execute processing depending on the specified cause of the adsorption anomaly.

5. The substrate holding device according to claim 1, wherein the control section determines the presence or absence of adsorption anomaly of the substrate based on the result of the determination in the first determination, and specifies the cause of the adsorption anomaly based on the result of the determination in the second determination.

6. The substrate holding device according to claim 5, further comprising:
    a storage section that stores history information of the measurement result obtained by the measuring section,
    wherein the control section performs a third determination, in reference to the history information, that determines whether or not the physical quantity measured on a substrate different from the substrate mounted on the holding unit exceeds a first threshold value so as to specify the cause of the adsorption anomaly based on the result of the determination of first and third determinations.

7. A lithography apparatus for transferring a pattern onto a substrate, comprising:
    a holding unit that adsorbs and holds the substrate;
    a stage device or a transport hand for moving the holding unit;

a measuring section that measures a physical quantity relating to an adsorption force of the holding unit with the substrate mounted on the holding unit; and a control section that carries out a first determination that determines whether or not the measured physical quantity exceeds a first threshold value and a second determination that determines whether or not the measured physical quantity exceeds a second threshold value different from the first threshold value to determine the presence or absence of an adsorption anomaly of the substrate and to specify a cause of the adsorption anomaly based on the result of first and second determinations, if the control section determines that the adsorption anomaly is present, so as to control the stage device or the transport hand depending on the specified cause of the adsorption anomaly.

8. A device manufacturing method comprising the steps of:

transferring a pattern onto a substrate by the utilization of a lithography apparatus; and developing the transferred substrate, wherein the lithography apparatus comprises:

a holding unit that adsorbs and holds the substrate;

a stage device or a transport hand for moving the holding unit;

a measuring section that measures a physical quantity relating to an adsorption force of the holding unit with the substrate mounted on the holding unit; and a control section that carries out a first determination that determines whether or not the measured physical quantity exceeds a first threshold value and a second determination that determines whether or not the measured physical quantity exceeds a second threshold value different from the first threshold value to determine the presence or absence of an adsorption anomaly of the substrate and to specify a cause of the adsorption anomaly based on the result of first and second determinations, if the control section determines that the adsorption anomaly is present, so as to control the stage device or the transport hand depending on the specified cause of the adsorption anomaly.

9. A lithography apparatus for transferring a pattern onto a substrate, comprising:

a holding unit that adsorbs and holds the substrate;

a stage device or a transport hand for moving the holding unit;

a plurality of measuring sections that measure a physical quantity relating to an adsorption force of the holding unit with the substrate mounted on the holding unit; and a control section that carries out a first determination that carries out a first determination that determines whether or not all physical quantity measured by the plurality of measuring sections exceeds predetermined value and a second determination that determines whether or not the physical quantity measured by the plurality of measuring sections exceeds a predetermined range to determine the presence or absence of an adsorption anomaly of the substrate and to specify a cause of the adsorption anomaly based on the result of first and second determinations, if the control section determines that the adsorption anomaly is present, so as to control the stage device or the transport hand depending on the specified cause of the adsorption anomaly.

10. A lithography apparatus for transferring a pattern onto a substrate, comprising:

a holding unit that adsorbs and holds the substrate;

a stage device or a transport hand for moving the holding unit;

a measuring section that measures a physical quantity relating to an adsorption force of the holding unit with the substrate mounted on the holding unit; and a control section that carries out a first determination that determines whether or not the time required for the physical quantity measured by the measuring section to reach a threshold value exceeds a first time and a second determination that determines whether or not the time required for the physical quantity measured by the measuring section to reach a threshold value exceeds a second time different from the first time to determine the presence or absence of an adsorption anomaly of the substrate and to specify a cause of the adsorption anomaly based on the result of first and second determinations, if the control section determines that the adsorption anomaly is present, so as to control the stage device or the transport hand depending on the specified cause of the adsorption anomaly.

11. A stage device holding a substrate to move, comprising:

a holding unit that adsorbs and holds the substrate by reducing the pressure in a space formed between the substrate;

a pressure sensor that measures the pressure in the space or a space that communicates with the space with the substrate mounted on the holding unit;

a control section that carries out a first determination that determines whether or not the measured pressure exceeds a first threshold value and a second determination that determines whether or not the measured pressure exceeds a second threshold value different from the first threshold value to move the substrate by a predetermined speed or acceleration if the measured pressure is lower than the first threshold value, and to move the substrate by a speed or acceleration that is lower than the predetermined speed or acceleration if the measured pressure is higher than the first threshold value and lower than the second threshold value.

12. A substrate transport device holding a substrate to move, comprising:

a holding unit that adsorbs and holds the substrate by reducing the pressure in a space formed between the substrate;

a pressure sensor that measures the pressure in the space or a space that communicates with the space with the substrate mounted on the holding unit;

a control section that carries out a first determination that determines whether or not the measured pressure exceeds a first threshold value and a second determination that determines whether or not the measured pressure exceeds a second threshold value different from the first threshold value to move the substrate by a predetermined speed or acceleration if the measured pressure is lower than the first threshold value, and to move the substrate by a speed or acceleration that is lower than the predetermined speed or acceleration if the measured pressure is higher than the first threshold value and lower than the second threshold value.

13. A stage device holding a substrate to move, comprising:

a holding unit that adsorbs and holds the substrate by reducing the pressure in a space formed between the substrate;

a plurality of pressure sensors that measures the pressure in the space or a space that communicates with the space with the substrate mounted on the holding unit;

a control section that carries out a first determination that determines whether or not all pressures measured by the plurality of pressure sensor exceed predetermined value and a second determination that determines whether or not a distribution of the pressures measured by the plurality of pressure sensors exceeds a predetermined range to move the substrate by a predetermined speed or acceleration if all the pressure measured by the plurality of pressure sensor are lower than the predetermined value, and to move the substrate by a speed or acceleration that is lower than the predetermined speed or acceleration if the pressure measured by at least one of the plurality of pressure sensor is higher than the predetermined value and the distribution of the pressures exceeds the predetermined range.

14. A substrate transport device holding a substrate to move, comprising:
a holding unit that adsorbs and holds the substrate by reducing the pressure in a space formed between the substrate;
a plurality of pressure sensors that measures the pressure in the space or a space that communicates with the space with the substrate mounted on the holding unit;
a control section that carries out a first determination that determines whether or not all pressures measured by the plurality of pressure sensor exceed a predetermined value and a second determination that determines whether or not a distribution of the pressures measured by the plurality of pressure sensors exceeds a predetermined range to move the substrate by a predetermined speed or acceleration if all the pressures measured by the plurality of pressure sensors are lower than the predetermined value, and to move the substrate by a speed or acceleration that is lower than the predetermined speed or acceleration if the pressure measured by at least one of the plurality of pressure sensor is higher than the predetermined value and the distribution of the pressure exceeds the predetermined range.

15. A stage device holding a substrate to move, comprising:
a holding unit that adsorbs and holds the substrate by reducing the pressure in a space formed between the substrate;
a pressure sensor that measures the pressure in the space or a space that communicates with the space with the substrate mounted on the holding unit;
a control section that carries out a first determination that determines whether or not the time required for the pressure measured by the pressure sensor to reach a threshold value exceeds a first time and a second determination that determines whether or not the time required for the pressure measured by the pressure sensor to reach a threshold value exceeds a second time different from the first time to move the substrate by a predetermined speed or acceleration if the time required to reach the pressure measured by the pressure sensor is shorter than the first time, and to move the substrate by a speed or acceleration that is lower than the predetermined speed or acceleration if the time required to reach the pressure measured by the pressure sensor is longer than the first time and shorter than the second time.

16. A substrate transport device holding a substrate to move, comprising:
a holding unit that adsorbs and holds the substrate by reducing the pressure in a space formed between the substrate;
a pressure sensor that measures the pressure in the space or a space that communicates with the space with the substrate mounted on the holding unit;
a control section that carries out a first determination that determines whether or not the time required for the pressure measured by the pressure sensor to reach a threshold value exceeds a first time and a second determination that determines whether or not the time required for the pressure measured by the pressure sensor to reach a threshold value exceeds a second time different from the first time to move the substrate by a predetermined speed or acceleration if the time required to reach the pressure measured by the pressure sensor is shorter than the first time, and to move the substrate by a speed or acceleration that is lower than the predetermined speed or acceleration if the time required to reach the pressure measured by the pressure sensor is longer than the first time and shorter than the second time.

17. The substrate holding device according to claim 1, wherein the cause of the adsorption anomaly comprises an adsorption anomaly caused by the warp of the substrate and an adsorption anomaly not caused by the warp of the substrate.

18. The substrate holding device according to claim 17, comprising:
a stage device or a transport hand for moving the holding unit; and
wherein if there is an anomaly caused by the warp of the substrate, the stage device or the transport hand moves the holding unit by a speed or acceleration that is lower than that if there is no adsorption anomaly.

19. The substrate holding device according to claim 3, wherein the cause of the adsorption anomaly comprises an adsorption anomaly caused by the warp of the substrate and an adsorption anomaly not caused by the warp of the substrate.

20. The substrate holding device according to claim 19, comprising:
a stage device or a transport hand for moving the holding unit; and
wherein if there is an anomaly caused by the warp of the substrate, the stage device or the transport hand moves the holding unit by a speed or acceleration that is lower than that if there is no adsorption anomaly.

21. The substrate holding device according to claim 4, wherein the cause of the adsorption anomaly comprises an adsorption anomaly caused by the warp of the substrate and an adsorption anomaly not caused by the warp of the substrate.

22. The substrate holding device according to claim 21, comprising:
a stage device or a transport hand for moving the holding unit; and
wherein if there is an anomaly caused by the warp of the substrate, the stage device or the transport hand moves the holding unit by a speed or acceleration that is lower than that if there is no adsorption anomaly.

* * * * *